(12) United States Patent
Komo et al.

(10) Patent No.: US 11,764,126 B2
(45) Date of Patent: Sep. 19, 2023

(54) SEMICONDUCTOR DEVICE AND METHOD OF MANUFACTURING SEMICONDUCTOR DEVICE

(71) Applicant: Mitsubishi Electric Corporation, Tokyo (JP)

(72) Inventors: Hideo Komo, Tokyo (JP); Takeshi Omaru, Tokyo (JP); Takuya Tsuru, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 294 days.

(21) Appl. No.: 17/280,756

(22) PCT Filed: Nov. 12, 2018

(86) PCT No.: PCT/JP2018/041829
§ 371 (c)(1),
(2) Date: Mar. 26, 2021

(87) PCT Pub. No.: WO2020/100191
PCT Pub. Date: May 22, 2020

(65) Prior Publication Data
US 2021/0343623 A1 Nov. 4, 2021

(51) Int. Cl.
*H01L 29/15* (2006.01)
*H01L 23/40* (2006.01)
(Continued)

(52) U.S. Cl.
CPC ...... *H01L 23/4012* (2013.01); *H01L 23/3107* (2013.01); *H01L 23/367* (2013.01);
(Continued)

(58) Field of Classification Search
CPC ............... H01L 23/367; H01L 23/3107; H01L 23/4012; H01L 25/117; H01L 2023/405; H01L 2023/4068; H01L 2023/4087
(Continued)

(56) References Cited

U.S. PATENT DOCUMENTS 9,842,799 B2 * 12/2017 Jang .................. H01L 23/367
2009/0302444 A1 * 12/2009 Ueda .................. H01L 25/117
438/109
(Continued)

FOREIGN PATENT DOCUMENTS

JP  2011211018 A  10/2011

OTHER PUBLICATIONS

International Search Report issued in PCT/JP2018/041829; dated Jan. 15, 2019.

*Primary Examiner* — Nitin Parekh
(74) *Attorney, Agent, or Firm* — Studebaker & Brackett PC

(57) ABSTRACT

An object of the present invention is to provide a semiconductor device whose surfaces on both sides can be cooled and which has a function of insulating, on both the surfaces, the internal structure of a semiconductor package from the outside. The semiconductor device includes a first semiconductor package and a second semiconductor package. The second semiconductor package is joined on the first semiconductor package in such a manner that a first exposed surface of the first semiconductor package and a fourth exposed surface of the second semiconductor package are connected so as to face each other, and a second exposed surface of the first semiconductor package and a third exposed surface of the second semiconductor package are connected so as to face each other.

28 Claims, 23 Drawing Sheets

(51) Int. Cl.
*H01L 23/31* (2006.01)
*H01L 23/367* (2006.01)
*H01L 23/00* (2006.01)
*H01L 25/11* (2006.01)
*H01L 25/00* (2006.01)

(52) U.S. Cl.
CPC .............. *H01L 24/29* (2013.01); *H01L 24/83* (2013.01); *H01L 25/117* (2013.01); *H01L 25/50* (2013.01); *H01L 2023/405* (2013.01); *H01L 2023/4031* (2013.01); *H01L 2023/4068* (2013.01); *H01L 2023/4087* (2013.01); *H01L 2224/29139* (2013.01); *H01L 2224/29144* (2013.01); *H01L 2224/83895* (2013.01)

(58) Field of Classification Search
USPC .................................................. 257/707, 713
See application file for complete search history.

(56) References Cited

U.S. PATENT DOCUMENTS

| | | | |
|---|---|---|---|
| 2011/0316143 A1* | 12/2011 | Noritake | H01L 23/3107 257/713 |
| 2012/0008282 A1* | 1/2012 | Ide | H01L 23/473 361/702 |
| 2015/0208550 A1* | 7/2015 | Rugg | H05K 7/2039 361/713 |
| 2015/0262904 A1* | 9/2015 | Hung | H01L 25/0657 257/713 |
| 2016/0126205 A1* | 5/2016 | Kadoguchi | H01L 23/49582 438/107 |
| 2017/0162542 A1* | 6/2017 | Chen | H01L 21/56 |
| 2017/0314515 A1* | 11/2017 | Oono | H01L 23/4334 |
| 2019/0057921 A1* | 2/2019 | Ooshima | H01L 23/50 |
| 2019/0221490 A1* | 7/2019 | Fujita | H01L 23/49811 |
| 2020/0118933 A1* | 4/2020 | Kiel | H01L 25/115 |

* cited by examiner

F I G. 1
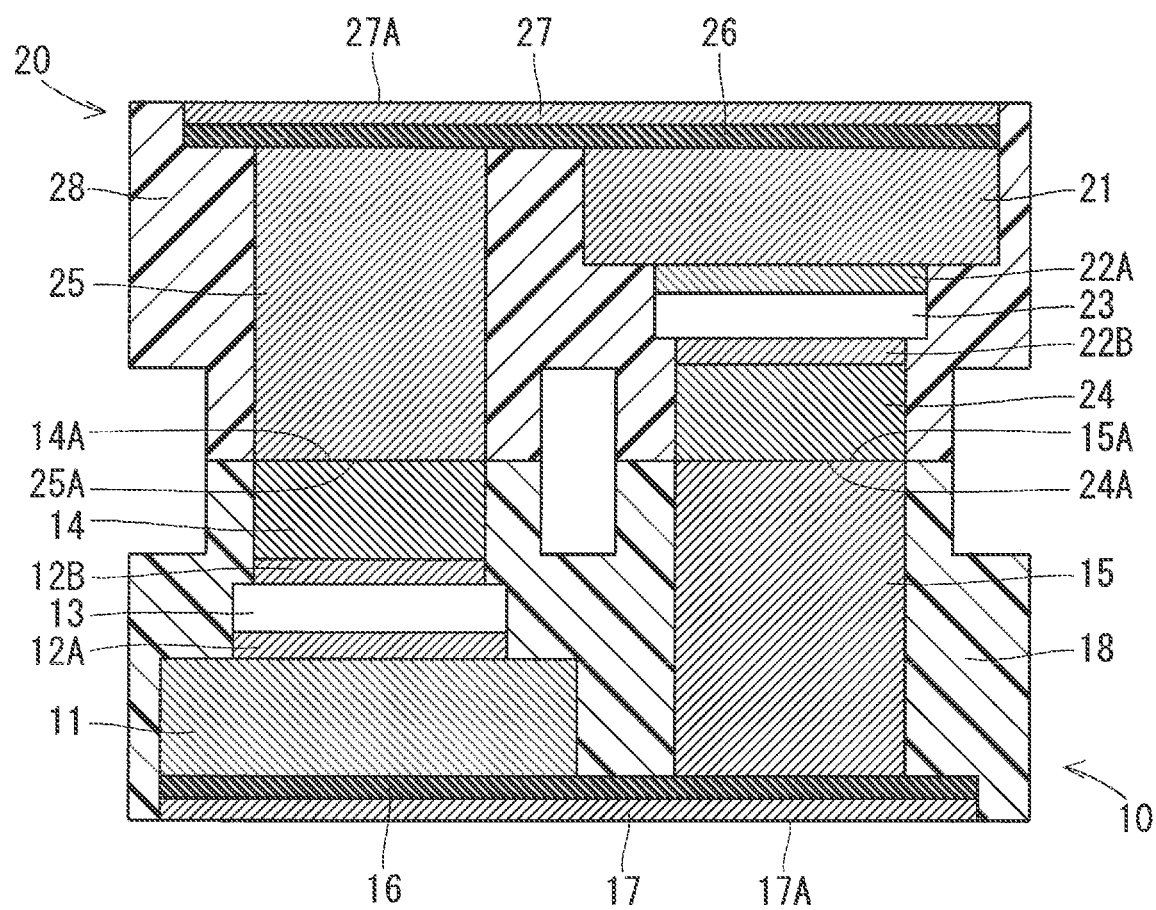

F I G. 1 7
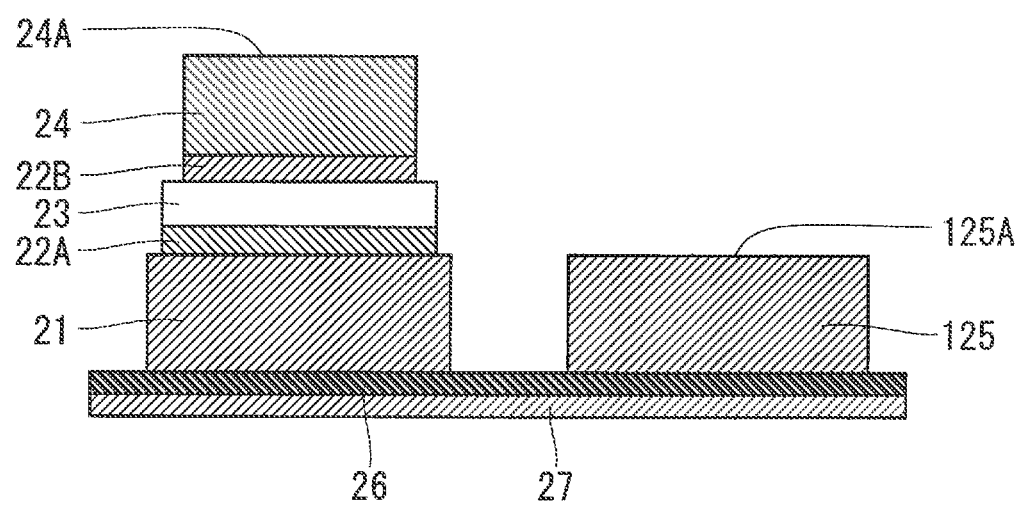

F I G. 2 5
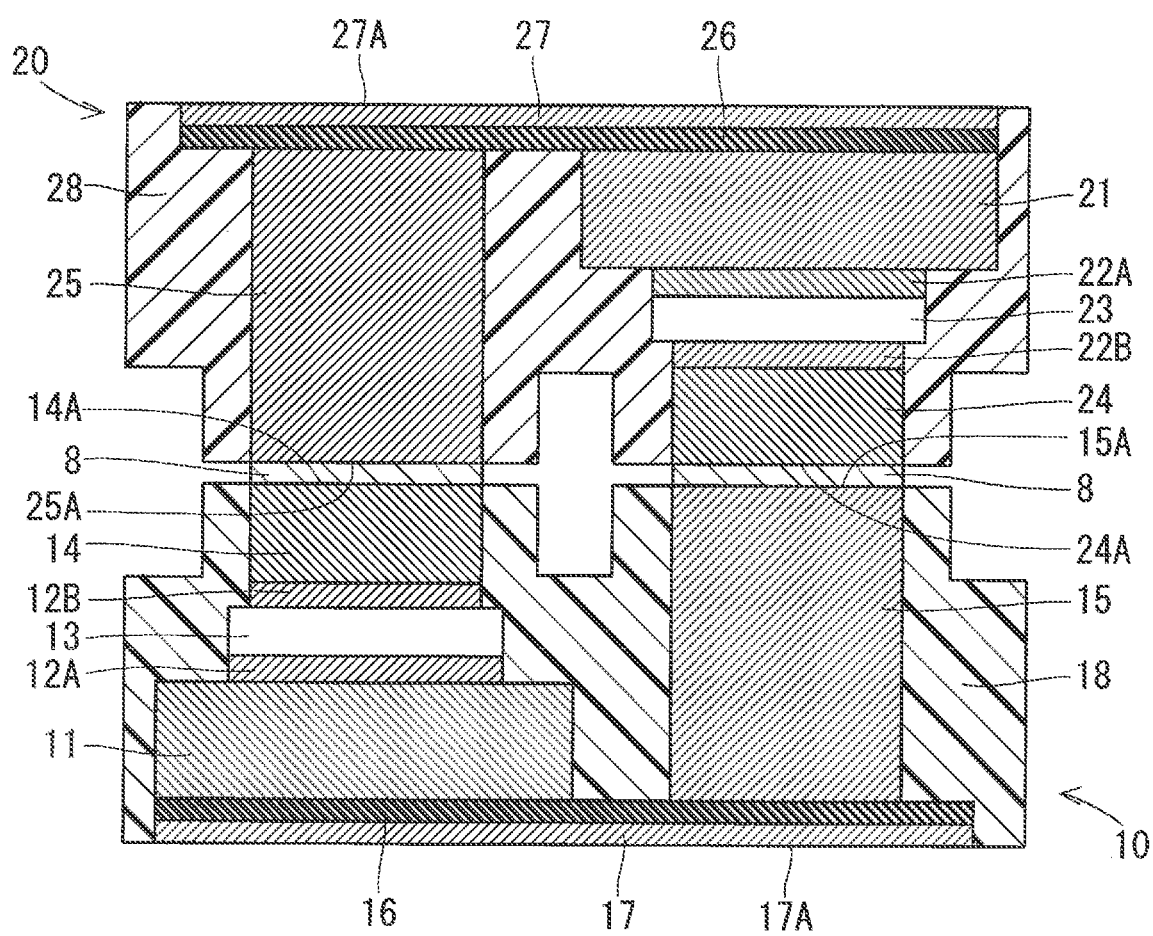

SEMICONDUCTOR DEVICE AND METHOD OF MANUFACTURING SEMICONDUCTOR DEVICE

TECHNICAL FIELD

The present invention relates to a semiconductor device and a method of manufacturing the semiconductor device.

BACKGROUND ART

As a structure for enhancing the cooling effect of a semiconductor chip contained in a semiconductor package, a structure for cooling both surfaces of a semiconductor device is known (see, for example, Patent Document 1).

PRIOR ART DOCUMENTS

Patent Documents

Patent Document 1: Japanese Patent Application Laid-Open No. 2011-211018

SUMMARY

Problem to be Solved by the Invention

When a heat dissipation surface double-sided cooling type semiconductor device is exposed as in Patent Document 1, a semiconductor chip inside a semiconductor package needs to be insulated, for each heat dissipation surface, from coolers provided on both heat dissipation surfaces of the semiconductor package when the semiconductor device is mounted.

The present invention has been made to solve the above problem, and an object of the present invention is to provide a semiconductor device whose surfaces on both sides can be cooled and which has a function of insulating, on both the surfaces, the internal structure of a semiconductor package from the outside.

Means to Solve the Problem

A semiconductor device according to the present invention includes a first semiconductor package and a second semiconductor package. The first semiconductor package includes: a first exposed surface on which a surface of a first metal block stacked on a first semiconductor chip is exposed; a second exposed surface on which a surface of a second metal block not stacked on the first semiconductor chip is exposed from the same side as the first exposed surface; and a first heat dissipation surface facing the first exposed surface and the second exposed surface and insulated from an internal structure including the first semiconductor chip, the first metal block, and the second metal block. The second semiconductor package includes: a third exposed surface on which a surface of a third metal block stacked on the second semiconductor chip is exposed; a fourth exposed surface on which a surface of a fourth metal block not stacked on the second semiconductor chip is exposed from the same side as the third exposed surface; and a second heat dissipation surface facing the third exposed surface and the fourth exposed surface and insulated from an internal structure including the second semiconductor chip, the third metal block, and the fourth metal block. The second semiconductor package is joined on the first semiconductor package in such a manner that the first exposed surface of the first semiconductor package and the fourth exposed surface of the second semiconductor package are connected so as to face each other, and the second exposed surface of the first semiconductor package and the third exposed surface of the second semiconductor package are connected so as to face each other.

Effects of the Invention

According to the present invention, it is possible to provide a semiconductor device whose surfaces on both sides can be cooled and which has a function of insulating, on both the surfaces, the internal structure of a semiconductor package from the outside.

The objects, features, aspects and advantages of the present invention will become more apparent from the following detailed description and the accompanying drawings.

BRIEF DESCRIPTION OF DRAWINGS

FIG. 1 is a sectional view showing the configuration of a semiconductor device according to a first embodiment.

FIG. 17 is a sectional view showing a second heat spreader and others arranged on the surface of a second insulating film.

FIG. 25 is a sectional view showing the configuration of a semiconductor device according to a sixth embodiment.

DESCRIPTION OF EMBODIMENTS

First Embodiment

Figure 2:
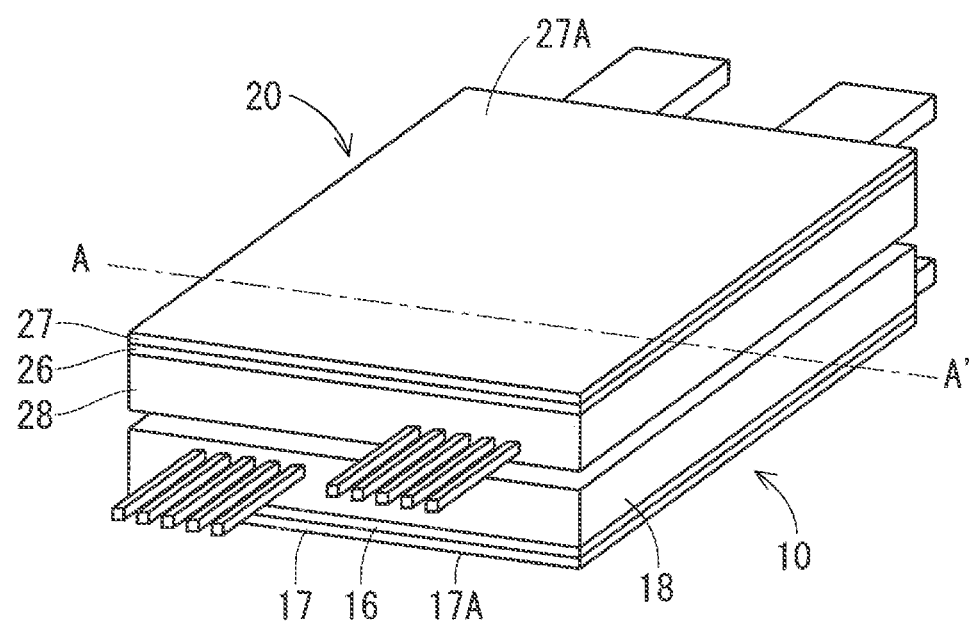
FIG. 2 is a perspective view showing the configuration of the semiconductor device according to the first embodiment.

FIG. 1 is a sectional view showing the configuration of a semiconductor device according to a first embodiment. FIG. 2 is a perspective view showing the configuration of the semiconductor device. FIG. 1 shows a section taken along a line A-A' shown in FIG. 2.

The semiconductor device is constituted of a first semiconductor package 10 and a second semiconductor package 20 joined on the first semiconductor package 10. The first semiconductor package 10 and the second semiconductor package 20 in the first embodiment both have the same configuration.

Figure 3:
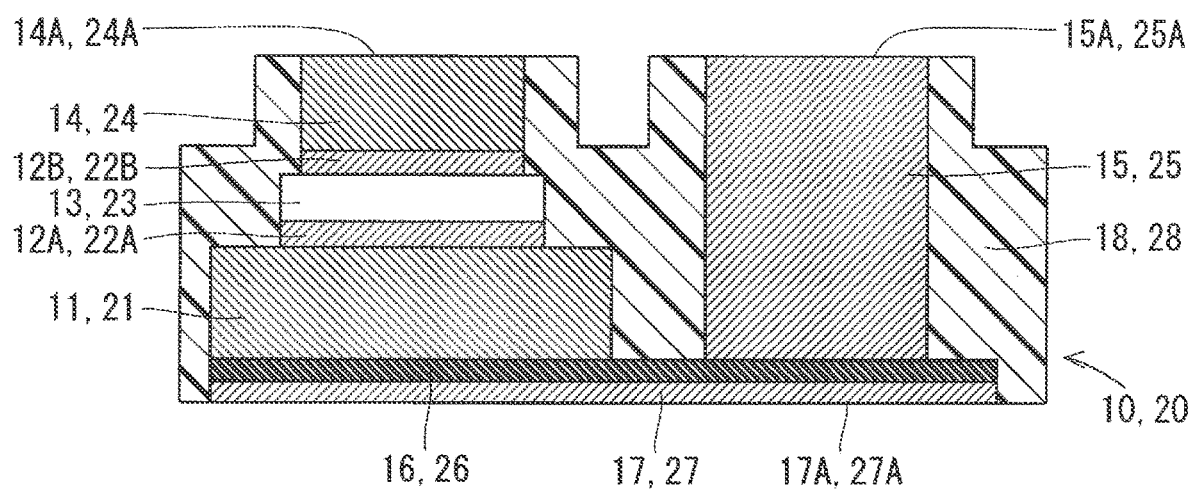
FIG. 3 is a sectional view showing the configurations of a first semiconductor package and a second semiconductor package.
Figure 4:
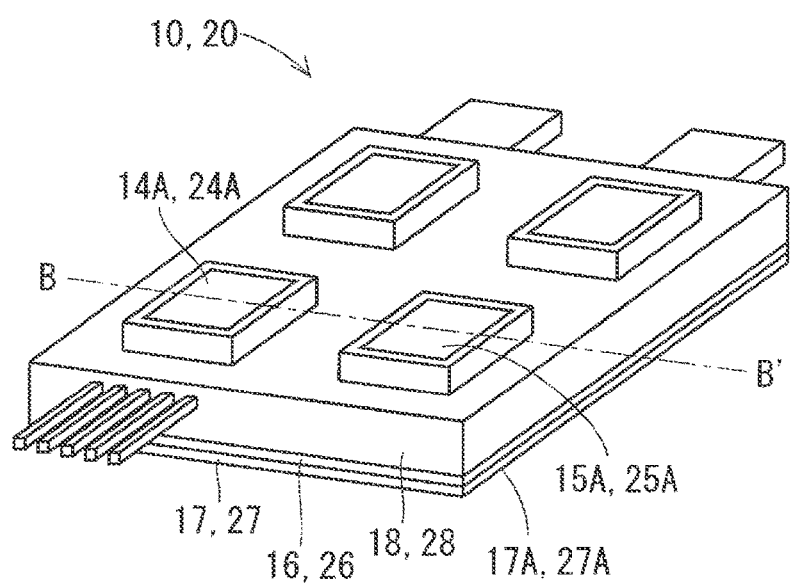
FIG. 4 is a perspective view showing the configurations of the first semiconductor package and the second semiconductor package.

FIG. 3 is a sectional view showing the configurations of the first semiconductor package 10 and the second semiconductor package 20. FIG. 4 is a perspective view showing the configurations of the first semiconductor package 10 and the second semiconductor package 20. FIG. 3 shows a section taken along B-B' shown in FIG. 4.

The first semiconductor package 10 includes a first insulating film 16, a first heat spreader 11, a first semiconductor chip 13, a first metal block 14, a second metal block 15, a first resin part 18, a first exposed surface 14A, a second exposed surface 15A, and a first heat dissipation surface 17A.

The first heat spreader 11 is provided on the surface of the first insulating film 16.

The first semiconductor chip 13 and the first metal block 14 are sequentially stacked on the surface of the first heat spreader 11. The first semiconductor chip 13 is fixed to the surface of the first heat spreader 11 by, for example, a solder 12A. The first metal block 14 is fixed on the first semiconductor chip 13 by, for example, a solder 12B.

The second metal block 15 is provided on the surface of the first insulating film 16 and adjacent to the first heat spreader 11. The second metal block 15 is not stacked on the first semiconductor chip 13. The second exposed surface 15A in the surface of the second metal block 15 is located at the same height as the first exposed surface 14A in the surface of the first metal block 14.

The first resin part 18 encloses the first insulating film 16, the first heat spreader 11, the first semiconductor chip 13, the first metal block 14, and the second metal block 15.

From the front surface of the first resin part 18, the first exposed surface 14A which is the surface of the first metal block 14, and the second exposed surface 15A which is the surface of the second metal block 15 are exposed. As described above, the first exposed surface 14A and the second exposed surface 15A are exposed from the same side of the first semiconductor package 10.

From the back surface of the first resin part 18, the first heat dissipation surface 17A is exposed. The first heat dissipation surface 17A faces the first exposed surface 14A and the second exposed surface 15A, and is insulated from the internal structure including the first semiconductor chip 13, the first metal block 14, and the second metal block 15. A first metal foil 17 is provided on the back surface of the first resin part 18, and the first metal foil 17 corresponds to the first heat dissipation surface 17A.

The configuration of the second semiconductor package 20 is the same as the configuration of the first semiconductor package 10. The second semiconductor package 20 includes a second insulating film 26, a second heat spreader 21, a second semiconductor chip 23, a third metal block 24, a fourth metal block 25, a second resin part 28, a third exposed surface 24A, a fourth exposed surface 25A, and a second heat dissipation surface 27A.

The second heat spreader 21 is provided on the surface of the second insulating film 26.

The second semiconductor chip 23 and the third metal block 24 are sequentially stacked on the surface of the second heat spreader 21. The second semiconductor chip 23 is fixed to the surface of the second heat spreader 21 by, for example, a solder 22A. The third metal block 24 is fixed on the second semiconductor chip 23 by, for example, a solder 22B.

The fourth metal block 25 is provided on the surface of the second insulating film 26 and adjacent to the second heat spreader 21. The fourth metal block 25 is not stacked on the second semiconductor chip 23. The fourth exposed surface 25A in the surface of the fourth metal block 25 is located at the same height as the third exposed surface 24A in the surface of the third metal block 24.

The second resin part 28 encloses the second insulating film 26, the second heat spreader 21, the second semiconductor chip 23, the third metal block 24, and the fourth metal block 25.

From the front surface of the second resin part 28, the third exposed surface 24A which is the surface of the third metal block 24, and the fourth exposed surface 25A which is the surface of the fourth metal block 25 are exposed. As described above, the third exposed surface 24A and the fourth exposed surface 25A are exposed from the same side of the second semiconductor package 20.

From the back surface of the second resin part 28, the second heat dissipation surface 27A is exposed. The second heat dissipation surface 27A faces the third exposed surface 24A and the fourth exposed surface 25A, and is insulated from the internal structure including the second semiconductor chip 23, the third metal block 24, and the fourth metal block 25. A second metal foil 27 is provided on the back surface of the second resin part 28, and the second metal foil 27 corresponds to the second heat dissipation surface 27A.

As shown in FIGS. 1 and 2, the second semiconductor package 20 is joined on the first semiconductor package 10. The first exposed surface 14A of the first semiconductor package 10 and the fourth exposed surface 25A of the second semiconductor package 20 are connected so as to face each other. The second exposed surface 15A of the first semiconductor package 10 and the third exposed surface 24A of the second semiconductor package 20 are connected so as to face each other.

The structure including the first semiconductor package 10 and the second semiconductor package 20 joined on the first semiconductor package 10 has a structure of two-fold symmetry in a sectional view.

The first exposed surface 14A and the second exposed surface 15A of the first semiconductor package 10 are located in the same plane. The third exposed surface 24A and the fourth exposed surface 25A of the second semiconductor package 20 are located in the same plane.

Figure 5:
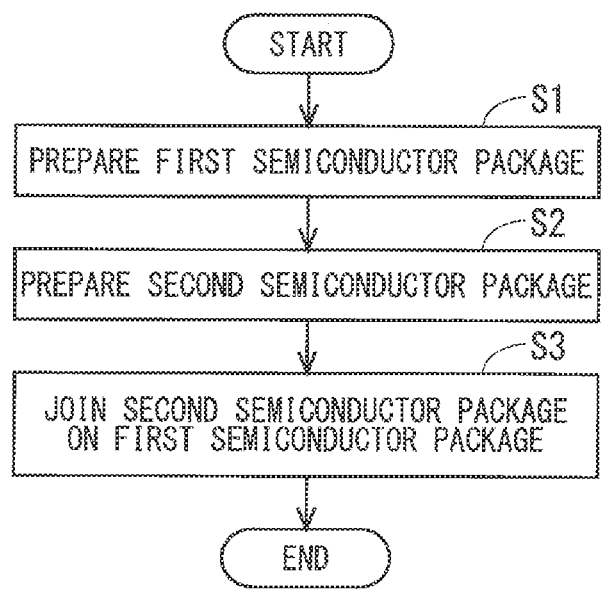
FIG. 5 is a flowchart showing a method of manufacturing the semiconductor device according to the first embodiment.

FIG. 5 is a flowchart showing a method of manufacturing the semiconductor device according to the first embodiment.

In step S1, the first semiconductor package 10 is prepared.

In step S2, the second semiconductor package 20 is prepared.

Figure 6:
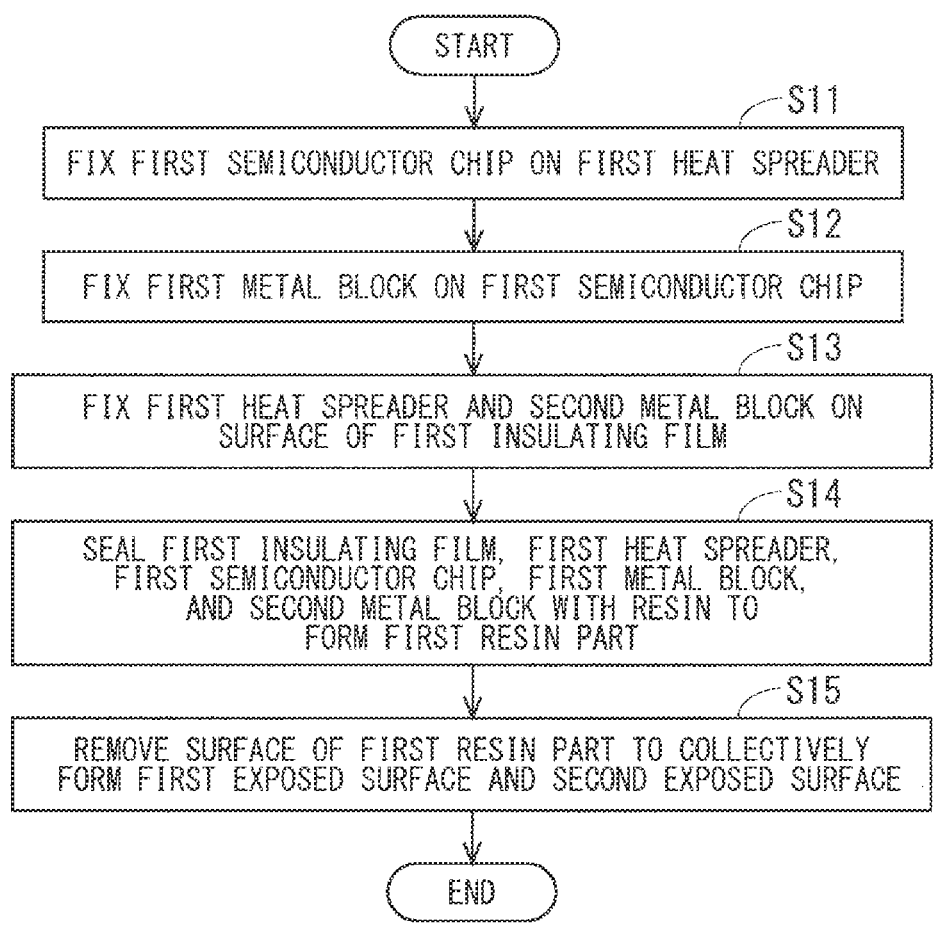
FIG. 6 is a flowchart showing details of the method of manufacturing the semiconductor device according to the first embodiment.

As described above, in the first embodiment, the first semiconductor package 10 and the second semiconductor package 20 have the same structure. The detailed process of step S1 for preparing the first semiconductor package 10 is described below, but the detailed process of step S2 is the same as the detailed process of step S1. FIG. 6 is a flowchart showing the details of step S1.

Figure 7:
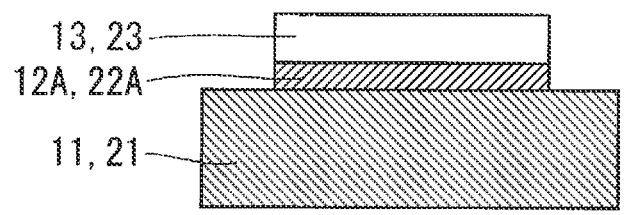
FIG. 7 is a sectional view showing a first semiconductor chip fixed on a first heat spreader.

In step S11, the first semiconductor chip 13 is fixed with the solder 12A on the first heat spreader 11. FIG. 7 is a sectional view showing the first semiconductor chip 13 fixed on the first heat spreader 11, FIG. 7 also shows the second semiconductor chip 23 fixed on the second heat spreader 21, regarding the second semiconductor package 20 manufactured in the same process.

Figure 8:
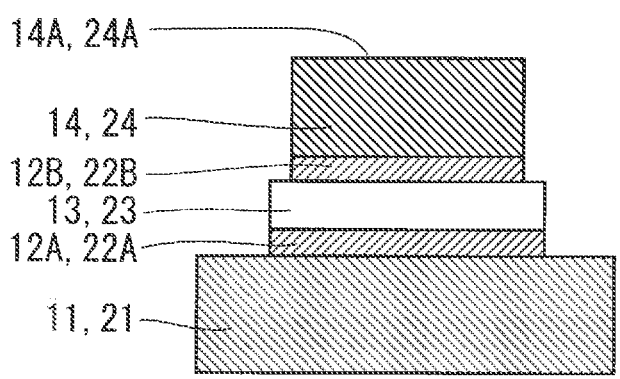
FIG. 8 is a sectional view showing a first metal block fixed on the first semiconductor chip.

In step S12, the first metal block 14 is fixed with the solder 12B on the first semiconductor chip 13. FIG. 8 is a sectional view showing the first metal block 14 fixed on the first semiconductor chip 13. FIG. 8 also shows the third metal block 24 fixed on the second semiconductor chip 23, regarding the second semiconductor package 20 manufactured in the same process.

Figure 9:
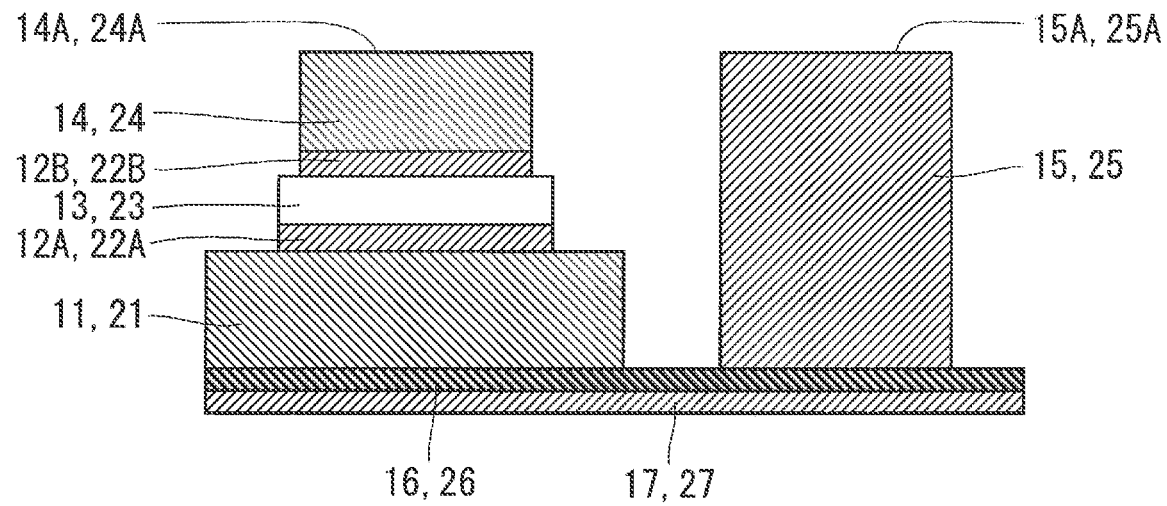
FIG. 9 is a sectional view showing the first heat spreader and others arranged on the surface of a first insulating film.
Figure 10:
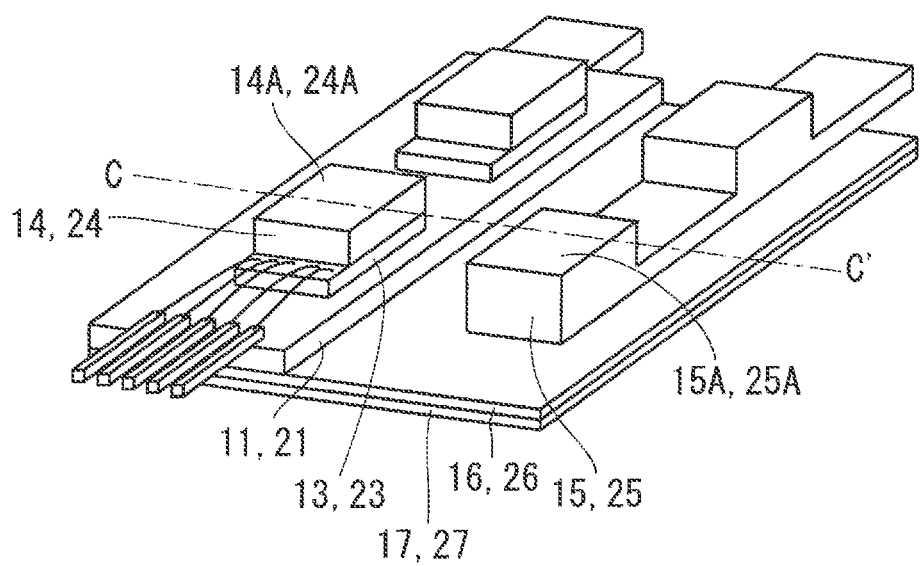
FIG. 10 is a perspective view showing the first heat spreader and others arranged on the surface of the first insulating film.

In step S13, the first heat spreader 11 and the second metal block 15 are arranged on the surface of the first insulating film 16. At this time, the second metal block 15 is arranged adjacent to the first heat spreader 11. Further, the first metal foil 17 is provided on the back surface of the first insulating film 16. FIG. 9 is a sectional view showing the first heat spreader 11 and others arranged on the surface of the first insulating film 16. FIG. 10 is a perspective view showing the first heat spreader 11 and others arranged on the surface of the first insulating film 16. FIG. 9 shows a section taken along a line C-C shown in FIG. 10. In addition, FIGS. 9 and 10 also show the second heat spreader 21 and others arranged on the surface of the second insulating film 26, regarding the second semiconductor package 20 manufactured in the same process.

Figure 11:
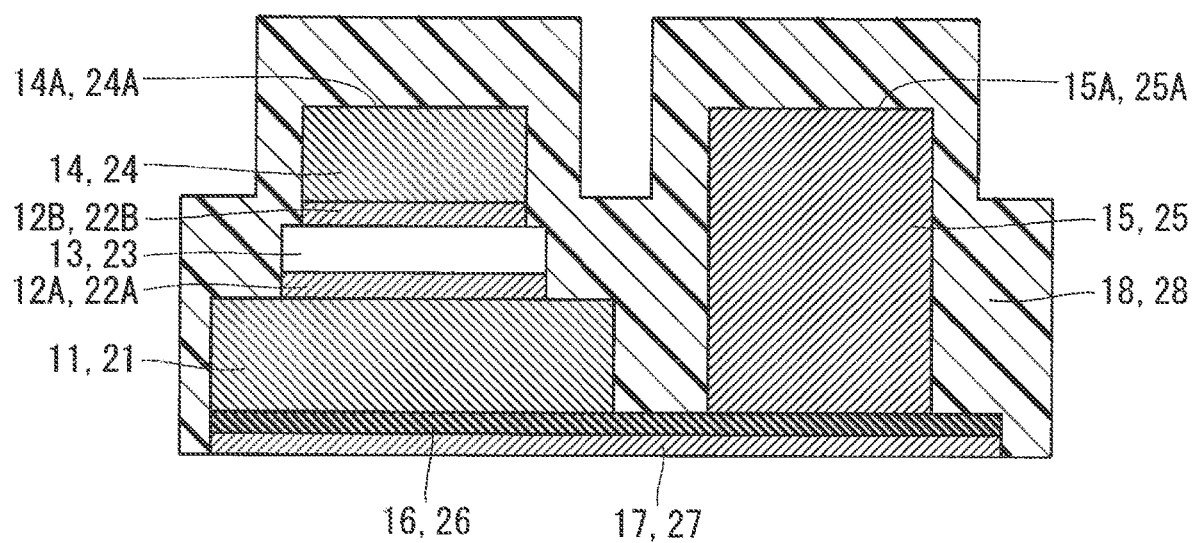
FIG. 11 is a sectional view showing an internal structure sealed by a first resin part.

In step S14, the first insulating film 16, the first heat spreader 11, the first semiconductor chip 13, the first metal block 14 and the second metal block 15 are sealed with resin to form the first resin part 18. FIG. 11 is a sectional view showing the internal structure sealed by the first resin part 18. The first resin part 18 is manufactured by, for example, molding. In addition, FIG. 11 also shows the internal structure sealed by the second resin part 28, regarding the second semiconductor package 20 manufactured in the same process.

In step S15, the surface of the first resin part 18 is removed to expose the surface of the first metal block 14 and the surface of the second metal block 15, and thereby the first exposed surface 14A and the second exposed surface 15A are collectively formed. For example, the first exposed surface 14A and the second exposed surface 15A are formed by cutting or grinding the surface of the first resin part 18.

The first semiconductor package 10 is prepared by the above steps S11 to S15. Further, the second semiconductor package 20 is prepared in step S2 through the same steps above. Subsequently, step S3 shown in FIG. 5 is performed.

Figure 12:
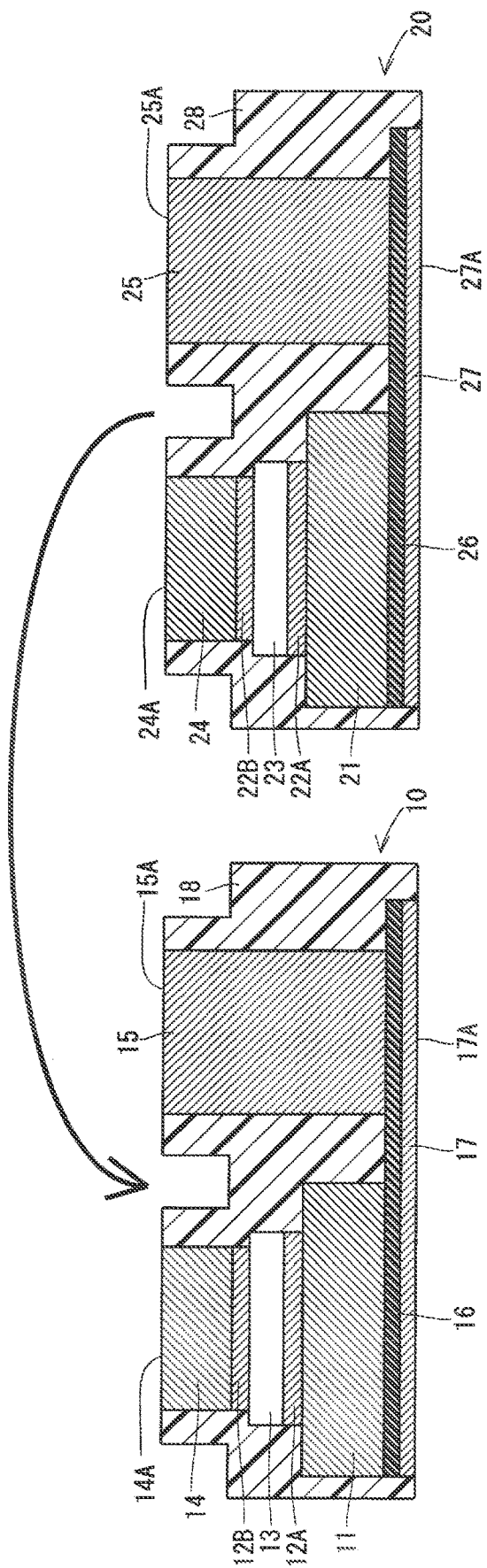
FIG. 12 is a sectional view showing the first semiconductor package and the second semiconductor package before joining.

In step S3, the second semiconductor package 20 is joined on the first semiconductor package 10. FIG. 12 is a sectional view showing the first semiconductor package 10 and the second semiconductor package 20 before joining. At this time, the second semiconductor package 20 is joined on the first semiconductor package 10 in such a manner that the first exposed surface 14A of the first semiconductor package 10 and the fourth exposed surface 25A of the second semiconductor package 20 are connected so as to face each other, and the second exposed surface 15A of the first semiconductor package 10 and the third exposed surface 24A of the second semiconductor package 20 are connected so as to face each other.

The semiconductor device shown in FIGS. 1 and 2 are formed by the above steps S1 to S3.

Summarizing the above, the semiconductor device according to the first embodiment includes the first semiconductor package 10 and the second semiconductor package 20. The first semiconductor package 10 includes the first exposed surface 14A, the second exposed surface 15A, and the first heat dissipation surface 17A. The first exposed surface 14A is a surface that is exposed among the surfaces of the first metal block 14 stacked on the first semiconductor chip 13. The second exposed surface 15A is a surface that is exposed among the surfaces of the second metal block 15 not stacked on the first semiconductor chip 13, from the same side as the first exposed surface 14A. The first heat dissipation surface 17A is a surface that faces the first exposed surface 14A and the second exposed surface 15A, and is insulated from the internal structure including the first semiconductor chip 13, the first metal block 14, and the second metal block 15. The second semiconductor package 20 includes the third exposed surface 24A, the fourth exposed surface 25A, and the second heat dissipation surface 27A. The third exposed surface 24A is a surface that is exposed among the surfaces of the third metal block 24 stacked on the second semiconductor chip 23. The fourth exposed surface 25A is a surface that is exposed among the surfaces of the fourth metal block 25 not stacked on the second semiconductor chip 23, from the same side as the third exposed surface 24A. The second heat dissipation surface 27A is a surface that faces the third exposed surface 24A and the fourth exposed surface 25A, and is insulated from the internal structure including the second semiconductor chip 23, the third metal block 24, and the fourth metal block 25. The second semiconductor package 20 is joined on the first semiconductor package 10 in such a manner that the first exposed surface 14A of the first semiconductor package 10 and the fourth exposed surface 25A of the second semiconductor package 20 are connected so as to face each other, and the second exposed surface 15A of the first semiconductor package 10 and the third exposed surface 24A of the second semiconductor package 20 are connected so as to face each other.

The above semiconductor device can be cooled on both surfaces and has a function of insulating, on both the surfaces, the internal structure of the semiconductor package from the outside. The double-sided cooling improves the cooling effect of the semiconductor chip. For example, when the semiconductor device is applied to an inverter device, an insulating plate does not need to be provided between the first heat dissipation surface 17A or the second heat dissipation surface 27A and a cooler. Therefore, the semiconductor device achieves the manufacturing of the inverter device at low cost.

Further, the first semiconductor package 10 of the semiconductor device according to the first embodiment includes the first heat spreader 11, the first insulating film 16, and the first resin part 18. The first semiconductor chip 13 and the first metal block 14 are sequentially stacked on the surface of the first heat spreader 11. The first heat spreader 11 and the second metal block 15 adjacent to the first heat spreader 11 are provided on the surface of the first insulating film 16. The first resin part 18 encloses the first insulating film 16, the first heat spreader 11, the first semiconductor chip 13, the first metal block 14, and the second metal block 15. The first exposed surface 14A of the first metal block 14 and the second exposed surface 15A of the second metal block 15 are exposed from the surface of the first resin part 18. The second semiconductor package 20 includes the second heat spreader 21, the second insulating film 26, and the second resin part 28. The second semiconductor chip 23 and the third metal block 24 are sequentially stacked on the surface of the second heat spreader 21. The second heat spreader 21 and the fourth metal block 25 adjacent to the second heat spreader 21 are provided on the surface of the second insulating film 26. The second resin part 28 encloses the second insulating film 26, the second heat spreader 21, the second semiconductor chip 23, the third metal block 24, and the fourth metal block 25. The third exposed surface 24A of the third metal block 24 and the fourth exposed surface 25A of the fourth metal block 25 are exposed from the surface of the second resin part 28.

The above semiconductor device can be cooled on both surfaces and has a function of insulating, on both the surfaces, the internal structure of the semiconductor package from the outside.

Further, in the semiconductor device according to the first embodiment, the structure including the first semiconductor package 10 and the second semiconductor package 20 joined on the first semiconductor package 10 has a structure of two-fold symmetry in a sectional view.

The above semiconductor device is realized by bonding together the first semiconductor package 10 and the second semiconductor package 20 having the same structure. In addition, the semiconductor device has a structure of a 2-in-1 type, and the manufacturing cost is reduced as compared with the 2-in-1 type semiconductor device manufactured by a bottom-up manufacturing method.

Further, in the semiconductor device according to the first embodiment, the first exposed surface 14A and the second exposed surface 15A of the first semiconductor package 10 are located in the same plane, and the third exposed surface 24A and the fourth exposed surface 25A of the second semiconductor package 20 are located in the same plane.

The above semiconductor device makes it possible to accurately bond together the first semiconductor package 10 and the second semiconductor package 20 having the same structure. As a result, the reliability of the semiconductor device is improved, and the manufacturing cost of the semiconductor device is also reduced.

Further, the method of manufacturing the semiconductor device according to the first embodiment includes the steps of: preparing the first semiconductor package 10; preparing the second semiconductor package 20; and joining the second semiconductor package 20 onto the first semiconductor package 10. The first semiconductor package 10 includes the first exposed surface 14A, the second exposed surface 15A, and the first heat dissipation surface 17A. The first exposed surface 14A is a surface that is exposed among the surfaces of the first metal block 14 stacked on the first semiconductor chip 13. The second exposed surface 15A is a surface that is exposed among the surfaces of the second metal block 15 not stacked on the first semiconductor chip 13, from the same side as the first exposed surface 14A. The first heat dissipation surface 17A is a surface that faces the first exposed surface 14A and the second exposed surface 15A, and is insulated from the internal structure including the first semiconductor chip 13, the first metal block 14, and the second metal block 15. The second semiconductor package 20 includes the third exposed surface 24A, the fourth exposed surface 25A, and the second heat dissipation surface 27A. The third exposed surface 24A is a surface that is exposed among the surfaces of the third metal block 24 stacked on the second semiconductor chip 23. The fourth exposed surface 25A is a surface that is exposed among the surfaces of the fourth metal block 25 not stacked on the second semiconductor chip 23, from the same side as the third exposed surface 24A. The second heat dissipation surface 27A is a surface that faces the third exposed surface 24A and the fourth exposed surface 25A, and is insulated from the internal structure including the second semiconductor chip 23, the third metal block 24, and the fourth metal block 25. In the process of joining the second semiconductor package 20 on the first semiconductor package 10, the first exposed surface 14A of the first semiconductor package 10 and the fourth exposed surface 25A of the second semiconductor package 20 are connected so as to face each other, and the second exposed surface 15A of the first semiconductor package 10 and the third exposed surface 24A of the second semiconductor package 20 are connected so as to face each other.

The above method of manufacturing the semiconductor device enables manufacturing of a semiconductor device whose surfaces on both sides can be cooled and which has a function of insulating, on both the surfaces, the internal structure of the semiconductor package from the outside. The double-sided cooling improves the cooling effect of the semiconductor chip. For example, when a semiconductor device manufactured by this method of manufacturing the semiconductor device is applied to an inverter device, an insulating plate does not need to be provided between the first heat dissipation surface 17A or the second heat dissipation surface 27A and the cooler. Therefore, the semiconductor device achieves the manufacturing of the inverter device at low cost.

Further, in the method of manufacturing the semiconductor device according to the first embodiment, the step of preparing the first semiconductor package 10 includes the steps of: sequentially stacking the first semiconductor chip 13 and the first metal block 14 onto the surface of the first heat spreader 11; arranging the first heat spreader 11 and the second metal block 15 adjacent to the first heat spreader 11 on the surface of the first insulating film 16; forming the first resin part 18 by sealing, with a resin, the first insulating film 16, the first heat spreader 11, the first semiconductor chip 13, the first metal block 14, and the second metal block 15 to from the first resin part 18; and removing the surface of the first resin part 18 to expose the surface of the first metal block 14 and the surface of the second metal block 15 from the surface of the first resin part 18, thereby collectively forming the first exposed surface 14A and the second exposed surface 15A. The step of preparing the second semiconductor package 20 includes the steps of: sequentially stacking the second semiconductor chip 23 and the third metal block 24 onto the surface of the second heat spreader 21; arranging the second heat spreader 21 and the fourth metal block 25 adjacent to the second heat spreader 21 on the surface of the second insulating film 26; sealing, with a resin, the second insulating film 26, the second heat spreader 21, the second semiconductor chip 23, the third metal block 24, and the fourth metal block 25 to form the second resin part 28; and removing the surface of the second resin part 28 to expose the surface of the third metal block 24 and the surface of the fourth metal block 25 from the surface of the second resin part 28, thereby collectively forming the third exposed surface 24A and the fourth exposed surface 25A.

The above method of manufacturing the semiconductor device enables manufacturing of a semiconductor device whose surfaces on both sides can be cooled and which has a function of insulating, on both the surfaces, the internal structure of the semiconductor package from the outside.

Further, in the method of manufacturing the semiconductor device according to the first embodiment, the structure including the first semiconductor package 10 and the second semiconductor package 20 joined on the first semiconductor package 10 has a structure of two-fold symmetry in a sectional view.

The above method of manufacturing the semiconductor device enables the manufacturing of the 2-in-1 type semiconductor device by bonding together the first semiconductor package 10 and the second semiconductor package 20 having the same structure. Therefore, the manufacturing cost is reduced as compared with the 2-in-1 type semiconductor device manufactured by the bottom-up manufacturing method.

Further, in the method of manufacturing the semiconductor device according to the first embodiment, the first exposed surface 14A and the second exposed surface 15A of the first semiconductor package 10 are located in the same plane, and the third exposed surface 24A and the fourth exposed surface 25A of the second semiconductor package 20 are located in the same plane.

The above method of manufacturing the semiconductor device makes it possible to accurately bond together the first semiconductor package 10 and the second semiconductor package 20 having the same structure. In addition, each exposed surface can be easily formed by collectively removing the surface of each resin part by grinding or cutting. As a result, the reliability of the semiconductor device is improved, and the manufacturing cost of the semiconductor device is also reduced.

Second Embodiment

A semiconductor device and a method of manufacturing the semiconductor device according to a second embodiment are described. The description of the same configuration and function as in the first embodiment is omitted.

Figure 13:
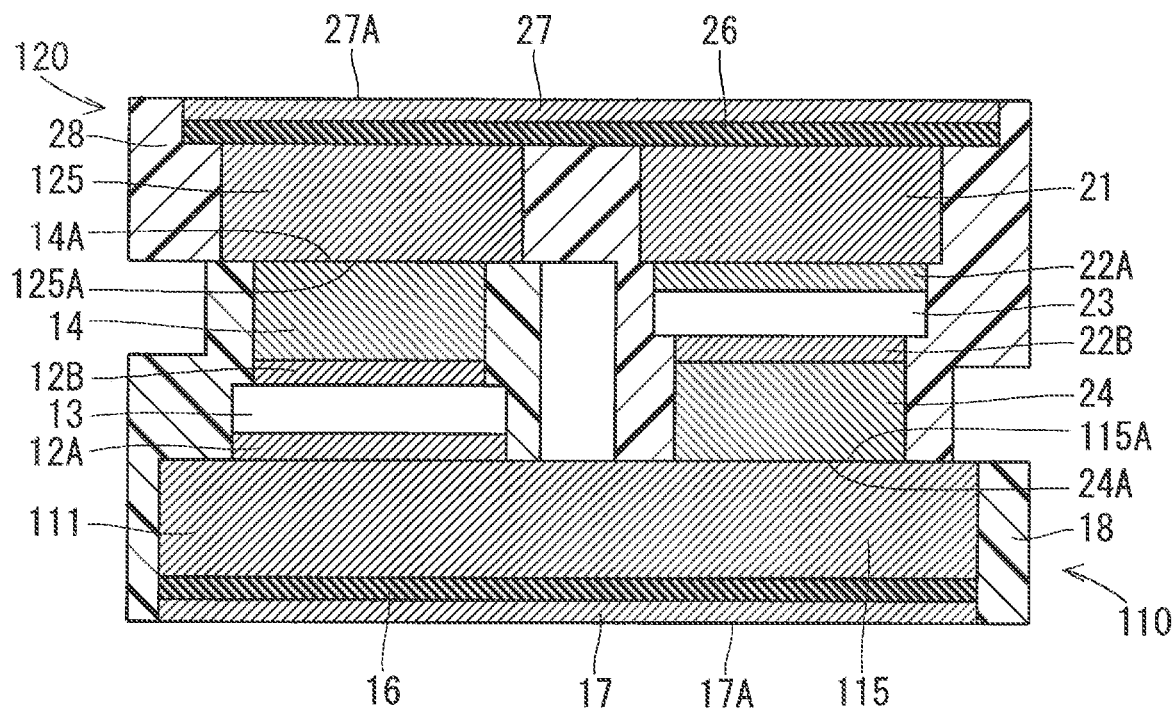
FIG. 13 is a sectional view showing the configuration of a semiconductor device according to a second embodiment.
Figure 14:
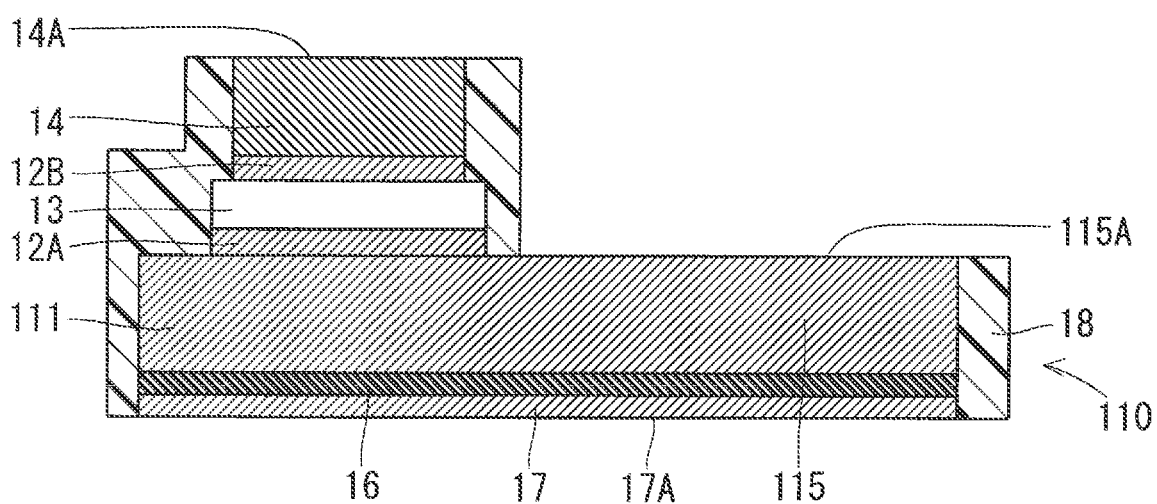
FIG. 14 is a sectional view showing the configuration of a first semiconductor package according to the second embodiment.
Figure 15:
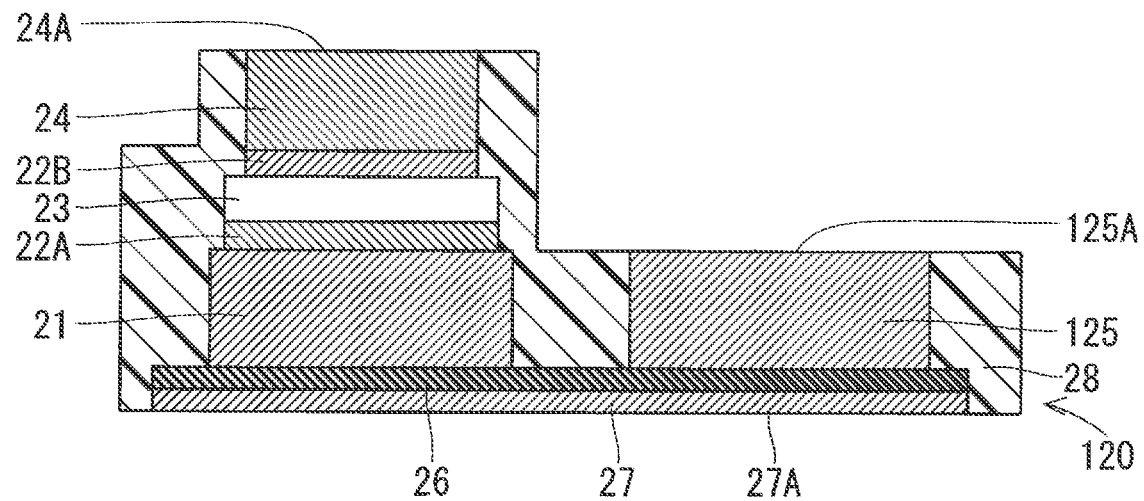
FIG. 15 is a sectional view showing the configuration of a second semiconductor package according to the second embodiment.

FIG. 13 is a sectional view showing the configuration of the semiconductor device according to the second embodiment. In the second embodiment, the configuration of a first semiconductor package 110 is different from a configuration of a second semiconductor package 120. FIG. 14 is a sectional view showing the configuration of the first semiconductor package 110. FIG. 15 is a sectional view showing the configuration of the second semiconductor package 120.

In the first semiconductor package 110, a first heat spreader 111 is integrated with a second metal block 115. A second exposed surface 115A of the second metal block 115 corresponds to the surface of the first heat spreader 111, and both are flush with each other. The second exposed surface 115A is located lower than a first exposed surface 14A, and the first exposed surface 14A and the second exposed surface 115A of the first semiconductor package 110 are not located in the same plane.

In the second semiconductor package 120, the thickness of a fourth metal block 125 corresponds to the thickness obtained by subtracting the thickness of a first semiconductor chip 13 and a first metal block 14 combined, from the thickness of a second heat spreader 21, a second semiconductor chip 23, and a third metal block 24 combined. In this case, the thicknesses of solders 12A, 12B, 22A, and 22B are ignored. A fourth exposed surface 125A is located lower than a third exposed surface 24A, and the third exposed surface 24A and the fourth exposed surface 125A are not located in the same plane.

Here, the total thickness of the first semiconductor chip 13, the first metal block 14, and the solders 12A and 12B joining the two is equal to the total thickness of the second semiconductor chip 23, the third metal block 24, and the solders 22A and 22B joining the two. In the semiconductor device having the above configuration, as shown in FIG. 13, the first exposed surface 14A is in contact with the fourth exposed surface 125A, and the second exposed surface 115A is in contact with the third exposed surface 24A.

Figure 16:
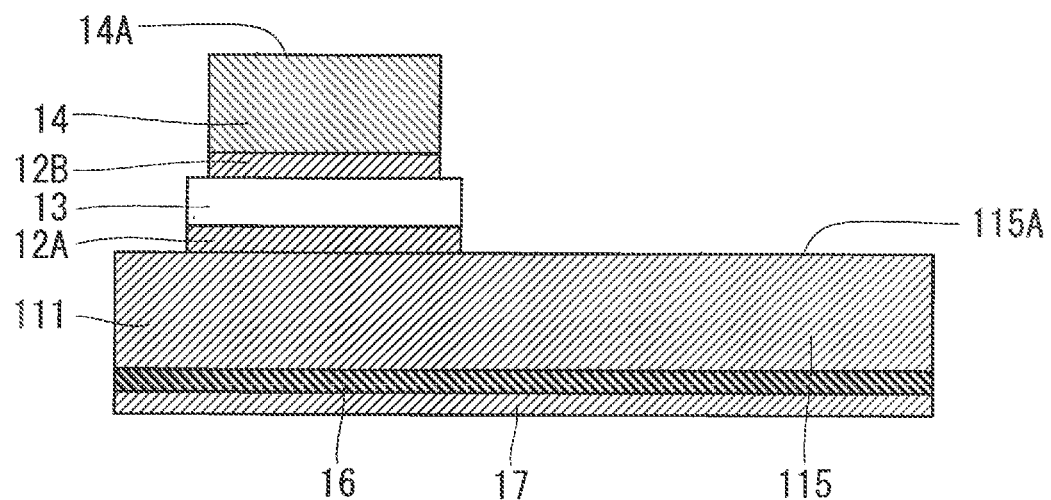
FIG. 16 is a sectional view showing a first heat spreader and others arranged on the surface of a first insulating film.

The process of preparing the first semiconductor package 110 according to the second embodiment is described. In step S1 shown in FIG. 5, the first heat spreader 111 on which the first semiconductor chip 13 and the first metal block 14 are sequentially stacked is arranged on the surface of a first insulating film 16. FIG. 16 is a sectional view showing the first heat spreader 111 and others arranged on the surface of the first insulating film 16. The first insulating film 16, the first heat spreader 111, the first semiconductor chip 13, and the first metal block 14 are sealed with a resin to form a first resin part 18. The surface of the first resin part 18 is removed to expose the first exposed surface 14A and the second exposed surface 115A. As a result, the first semiconductor package 110 shown in FIG. 14 is formed.

The process of preparing the second semiconductor package 120 according to the second embodiment is described. In step S2 shown in FIG. 5, the second heat spreader 21 on which the second semiconductor chip 23 and the third metal block 24 are sequentially stacked is arranged on the surface of a second insulating film 26. Further, the fourth metal block 125 is arranged on the surface of the second insulating film 26 and adjacent to the second heat spreader 21. FIG. 17 is a sectional view showing the second heat spreader 21 and others arranged on the surface of the second insulating film 26. The second insulating film 26, the second heat spreader 21, the second semiconductor chip 23, the third metal block 24, and the fourth metal block 125 are sealed with a resin to form a second resin part 28. The surface of the second resin part 28 is removed to expose the third exposed surface 24A and the fourth exposed surface 125A. As a result, the second semiconductor package 120 shown in FIG. 15 is formed.

In step S3 shown in FIG. 5, the second semiconductor package 120 is joined on the first semiconductor package 110. As a result, the semiconductor device shown in FIG. 3 is formed.

Summarizing the above, in the semiconductor device according to the second embodiment, the first heat spreader 111 and the second metal block 115 of the first semiconductor package 110 are integrated with each other. The second exposed surface 115A of the second metal block 115 is the surface of the first heat spreader 111.

The above semiconductor device enables the manufacturing process to be simplified.

Third Embodiment

A semiconductor device and a method of manufacturing the semiconductor device according to a third embodiment are described. The third embodiment is a subordinate concept of the first embodiment, and the semiconductor device in the third embodiment includes each configuration of the semiconductor device in the first embodiment. The description of the same configuration and function as in the first and second embodiments is omitted.

Figure 18:
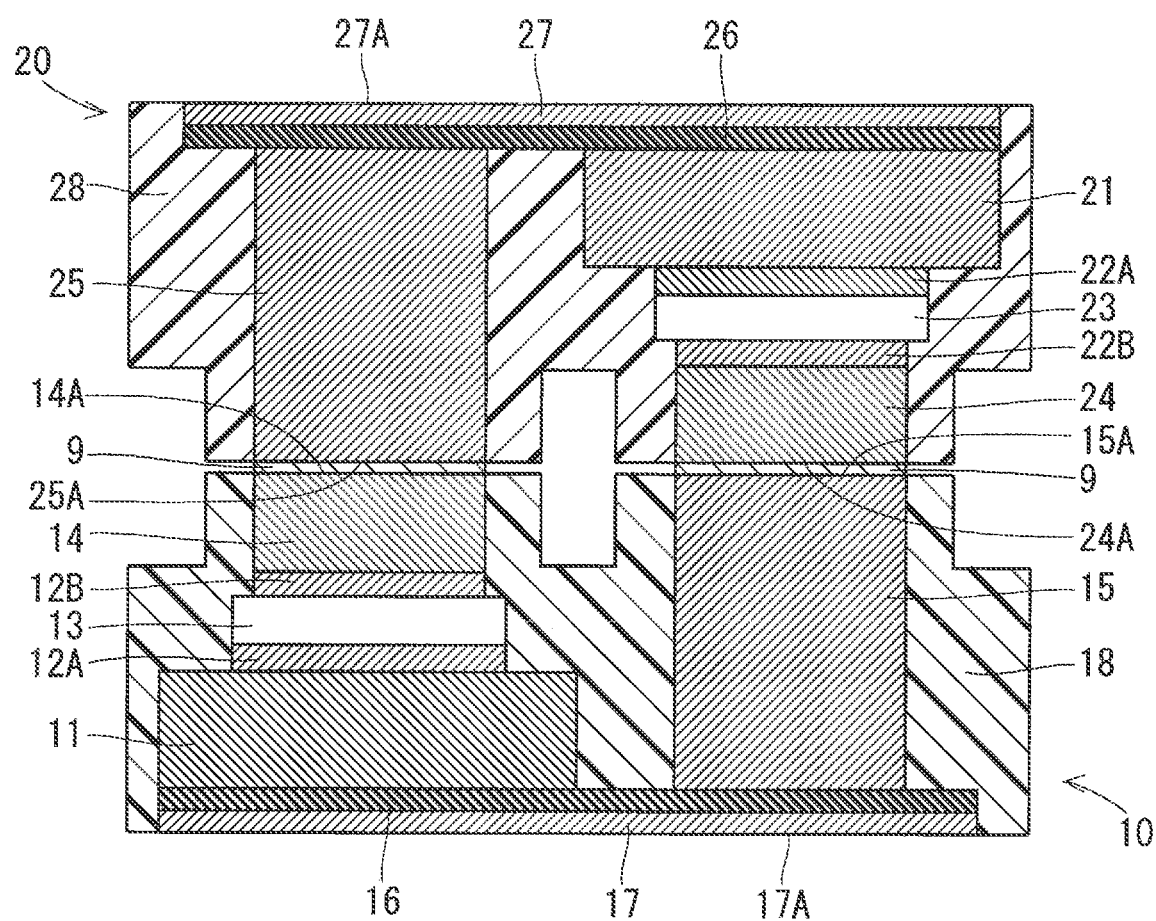
FIG. 18 is a sectional view showing the configuration of a semiconductor device according to a third embodiment.

FIG. 18 is a sectional view showing the configuration of the semiconductor device according to the third embodiment. The semiconductor device further includes a joining layer 9 joining the first semiconductor package 10 and the second semiconductor package 20. The joining layer 9 joins the first exposed surface 14A of the first semiconductor package 10 and the fourth exposed surface 25A of the second semiconductor package 20. Further, the joining layer 9 joins the second exposed surface 15A of the first semiconductor package 10 and the third exposed surface 24A of the second semiconductor package 20. The joining layer 9 contains gold (Au).

Figure 19:
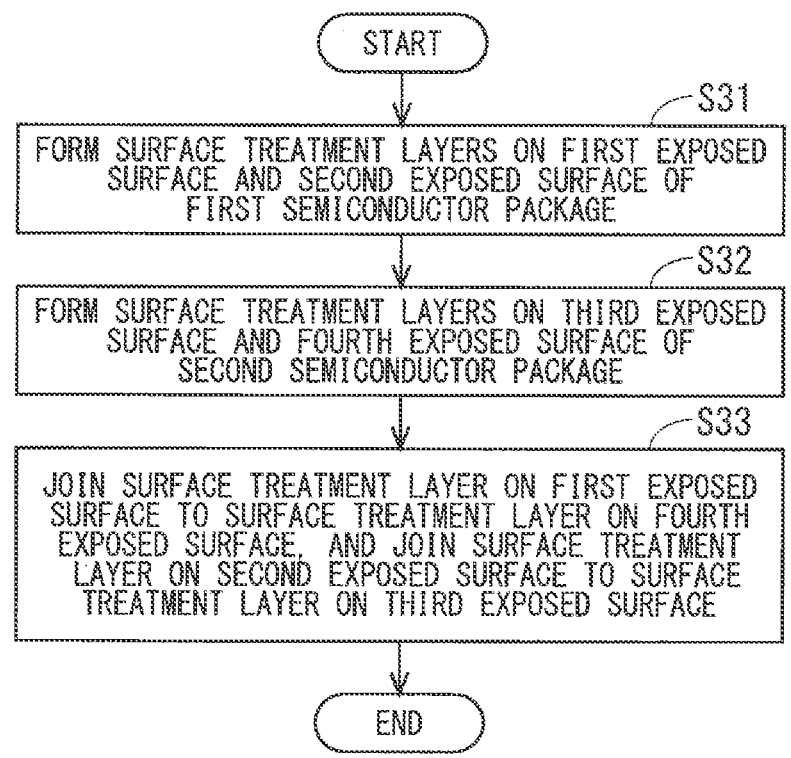
FIG. 19 is a flowchart showing details of a method of manufacturing the semiconductor device according to the third embodiment.

FIG. 19 is a flowchart showing the method of manufacturing the semiconductor device according to the third embodiment, and in particular, is the flowchart showing the details of step S3 in FIG. 5. Steps S1 and S2 are the same as in the first embodiment.

In step S31, surface treatment layers are formed on the first exposed surface 14A and the second exposed surface 15A of the first semiconductor package 10. The surface treatment layer contains Au. The surface treatment layer is formed by, for example, plating.

Figure 20:
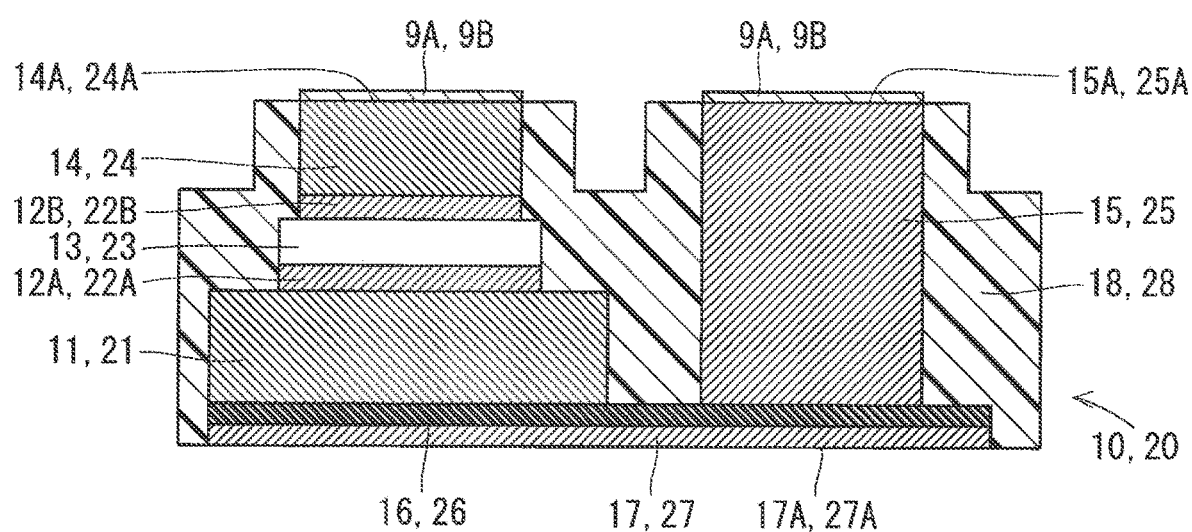
FIG. 20 is a sectional view showing a first semiconductor package and a second semiconductor package on which a surface treatment layer is formed.

In step S32, surface treatment layers are formed on the third exposed surface 24A and the fourth exposed surface 25A of the second semiconductor package 20. The surface treatment layer contains Au. The surface treatment layer is formed by, for example, plating. FIG. 20 is a sectional view showing the first semiconductor package 10 and the second semiconductor package 20 in which the surface treatment layers 9A and 9B are formed, respectively.

In step S33, the surface treatment layer 9A on the first exposed surface 14A and the surface treatment layer 9B on the fourth exposed surface 25A are joined to each other. Further, the surface treatment layer 9A on the second exposed surface 15A and the surface treatment layer 9B on the third exposed surface 24A are joined to each other.

By the above steps, the joining layer 9 shown in FIG. 18 is formed. The joining layer 9 joins the first semiconductor package 10 and the second semiconductor package 20.

The above joining layer 9 improves the joining properties between the first semiconductor package 10 and the second semiconductor package 20. The joining layer also improves the electrical and thermal resistance between the first semiconductor package 10 and the second semiconductor package 20. As a result, the reliability of the semiconductor device is improved.

Fourth Embodiment

A semiconductor device and a method of manufacturing the semiconductor device according to a fourth embodiment are described. The fourth embodiment is a subordinate concept of the first embodiment, and the semiconductor device in the fourth embodiment includes each configuration of the semiconductor device in the first embodiment. The description of the same configuration and function as in any of the first to third embodiments is omitted.

Figure 21:
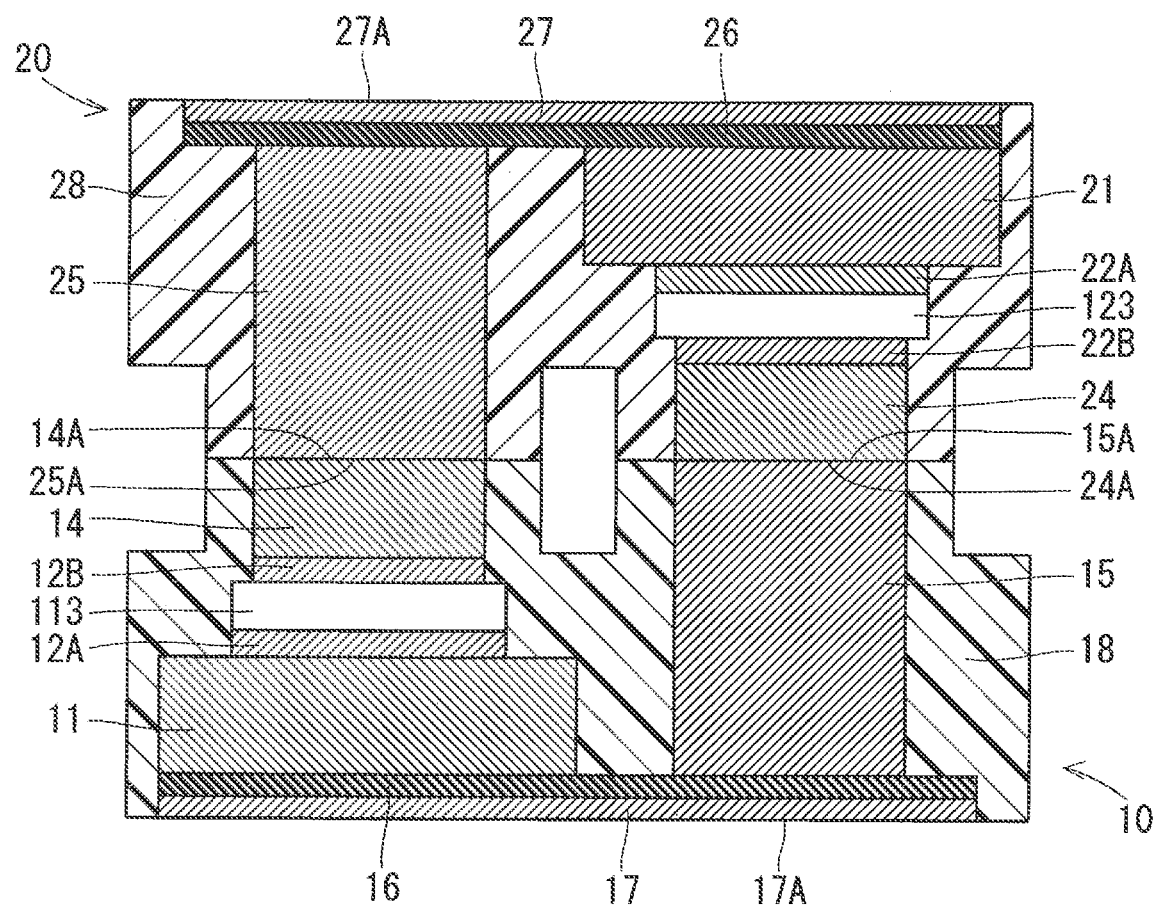
FIG. 21 is a sectional view showing the configuration of a semiconductor device according to a fourth embodiment.

FIG. 21 is a sectional view showing the configuration of the semiconductor device according to the fourth embodiment. A first semiconductor chip 113 and a second semiconductor chip 123 include silicon carbide (SiC). The first semiconductor chip 113 and the second semiconductor chip 123 are, for example, power semiconductor chips. The first semiconductor chip 113 and the second semiconductor chip 123 include, for example, a metal-oxide-semiconductor field-effect transistor (MOSFET) or an insulated gate bipolar transistor (IGBT).

As described above, the semiconductor device can also be applied to a semiconductor chip containing SiC. Therefore, the semiconductor device according to the fourth embodiment can be mounted on a power control device or the like.

Fifth Embodiment

A semiconductor device and a method of manufacturing the semiconductor device according to a fifth embodiment are described. The description of the same configuration and function as in any of the first to fourth embodiments is omitted.

The semiconductor device according to the fifth embodiment includes a reverse conducting insulated gate bipolar transistor (RC-IGBT) as a first semiconductor chip and a second semiconductor chip.

Figure 22:
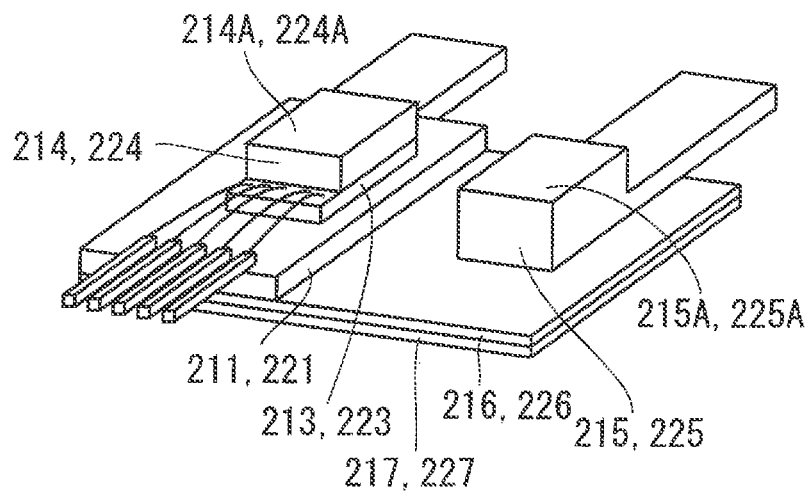
FIG. 22 is a perspective view showing a manufacturing process of a semiconductor device according to a fifth embodiment.
Figure 23:
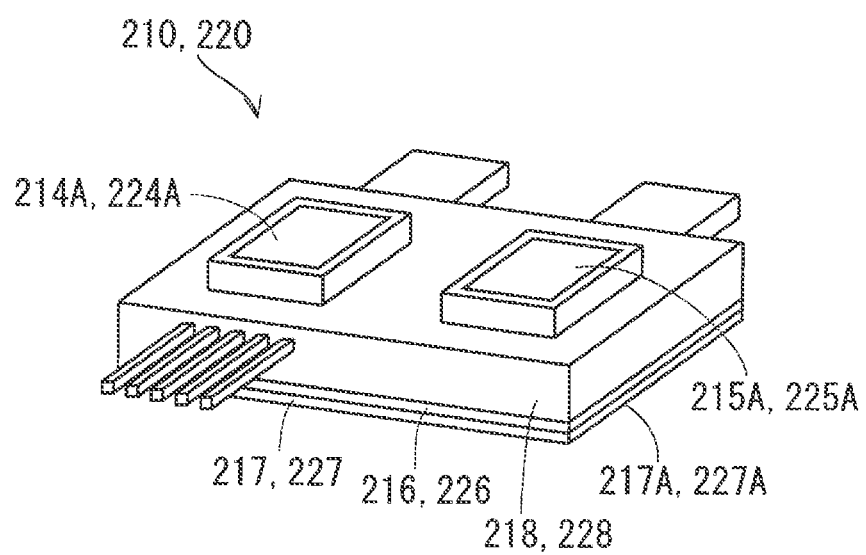
FIG. 23 is a perspective view showing the manufacturing process of the semiconductor device according to the fifth embodiment.
Figure 24:
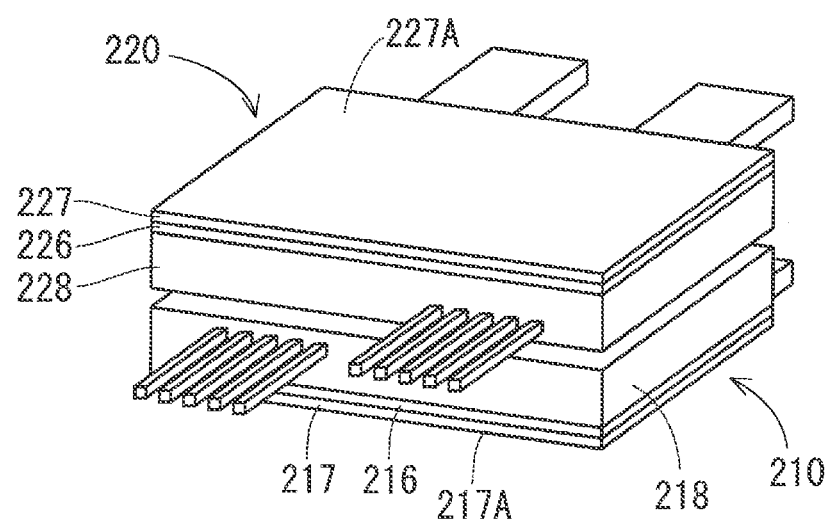
FIG. 24 is a perspective view showing the manufacturing process of the semiconductor device according to the fifth embodiment.

FIGS. 22 to 24 are perspective views showing a manufacturing process of the semiconductor device according to the fifth embodiment. In step S1 shown in FIG. 5, a first heat spreader 211 on which a first semiconductor chip 213 and a first metal block 214 are sequentially stacked is arranged on the surface of a first insulating film 216. Further, a second metal block 215 is arranged on the surface of the first insulating film 216 and adjacent to the first heat spreader 211. A first metal foil 217 is provided on the back surface of the first insulating film 216 (FIG. 22). The first insulating film 216, the first heat spreader 211, the first semiconductor chip 213, the first metal block 214, and the second metal block 215 are sealed with a resin to form a first resin part 218. The surface of the first resin part 218 is removed to expose a first exposed surface 214A and a second exposed surface 215A. A first heat dissipation surface 217A insulated from the internal structure is exposed from the back surface of the first resin part 218. As a result, a first semiconductor package 210 is formed (FIG. 23).

In step S2 shown in FIG. 5, a second heat spreader 221 on which a second semiconductor chip 223 and a third metal block 224 are sequentially stacked is arranged on the surface of a second insulating film 226. Further, a fourth metal block 225 is arranged on the surface of the second insulating film 226 and adjacent to the second heat spreader 221. A second metal foil 227 is provided on the back surface of the second insulating film 226 (FIG. 22). The second insulating film 226, the second heat spreader 221, the second semiconductor chip 223, the third metal block 224, and the fourth metal block 225 are sealed with a resin to form a second resin part 228. The surface of the second resin part 228 is removed to expose a third exposed surface 224A and a fourth exposed surface 225A. A second heat dissipation surface 227A insulated from the internal structure is exposed from the back surface of the second resin part 228. As a result, a second semiconductor package 220 is formed (FIG. 23).

In step S3 shown in FIG. 5, the second semiconductor package 220 is joined onto the first semiconductor package 210 to form the semiconductor device (FIG. 24).

As described above, the semiconductor device can also be applied to a semiconductor chip including the RC-IGBT. Therefore, the semiconductor device according to the fifth embodiment can be mounted on a power control device or the like.

Sixth Embodiment

A semiconductor device and a method of manufacturing the semiconductor device according to a sixth embodiment are described. The sixth embodiment is a subordinate concept of the first embodiment, and the semiconductor device in the sixth embodiment includes each configuration of the semiconductor device in the first embodiment. The description of the same configuration and function as in any of the first to fifth embodiments is omitted.

FIG. 25 is a sectional view showing the configuration of the semiconductor device according to the sixth embodiment. The semiconductor device further includes a joining layer 8 that joins the first semiconductor package 10 and the second semiconductor package 20. The joining layer 8 joins the first exposed surface 14A of the first semiconductor package 10 and the fourth exposed surface 25A of the second semiconductor package 20. Further, the joining layer 8 joins together the second exposed surface 15A of the first semiconductor package 10 and the third exposed surface 24A of the second semiconductor package 20.

The joining layer 8 is, for example, a low melting point solder. The melting point of the low melting point solder is lower than the melting point of the solders 12A and 12B that fix the first semiconductor chip 13 inside the first semiconductor package 10, or the solders 22A and 22B that fix the second semiconductor chip 23 inside the second semiconductor package 20. In this case, in step S3 shown in FIG. 5, the low melting point solder is used to join the first exposed surface 14A and the fourth exposed surface 25A together, and the second exposed surface 15A and the third exposed surface 24A together.

The low melting point solder applied to the joining layer 8 reduces thermal damage to the first semiconductor chip 13 and the second semiconductor chip 23 in the process of joining the first semiconductor package 10 and the second semiconductor package 20. As a result, the reliability of the semiconductor device is improved.

The joining layer 8 may be, for example, conductive grease. In this case, in step S3 shown in FIG. 5, the conductive grease is used to join the first exposed surface 14A and the fourth exposed surface 25A together, and the second exposed surface 15A and the third exposed surface 24A together.

The conductive grease applied to the joining layer 8 improves the electrical and thermal resistance between the first semiconductor package 10 and the second semiconductor package 20. As a result, high conductivity and high thermal conductivity are ensured.

The joining layer 8 may be, for example, a silver paste. In this case, in step S3 shown in FIG. 5, the silver paste is used to join the first exposed surface 14A and the fourth exposed surface 25A together, and the second exposed surface 15A and the third exposed surface 24A together. At that time, the silver paste is heated while being pressurized and is sintered.

Because the silver paste applied to the joining layer 8 is sintered, the joining properties of the silver paste are improved. As a result, the reliability of the semiconductor device is improved.

Seventh Embodiment

A semiconductor device and a method of manufacturing the semiconductor device according to a seventh embodiment are described. The seventh embodiment is a subordinate concept of the first embodiment, and the semiconductor device in the seventh embodiment includes each configuration of the semiconductor device in the first embodiment. The description of the same configuration and function as in any of the first to sixth embodiments is omitted.

Figure 26:
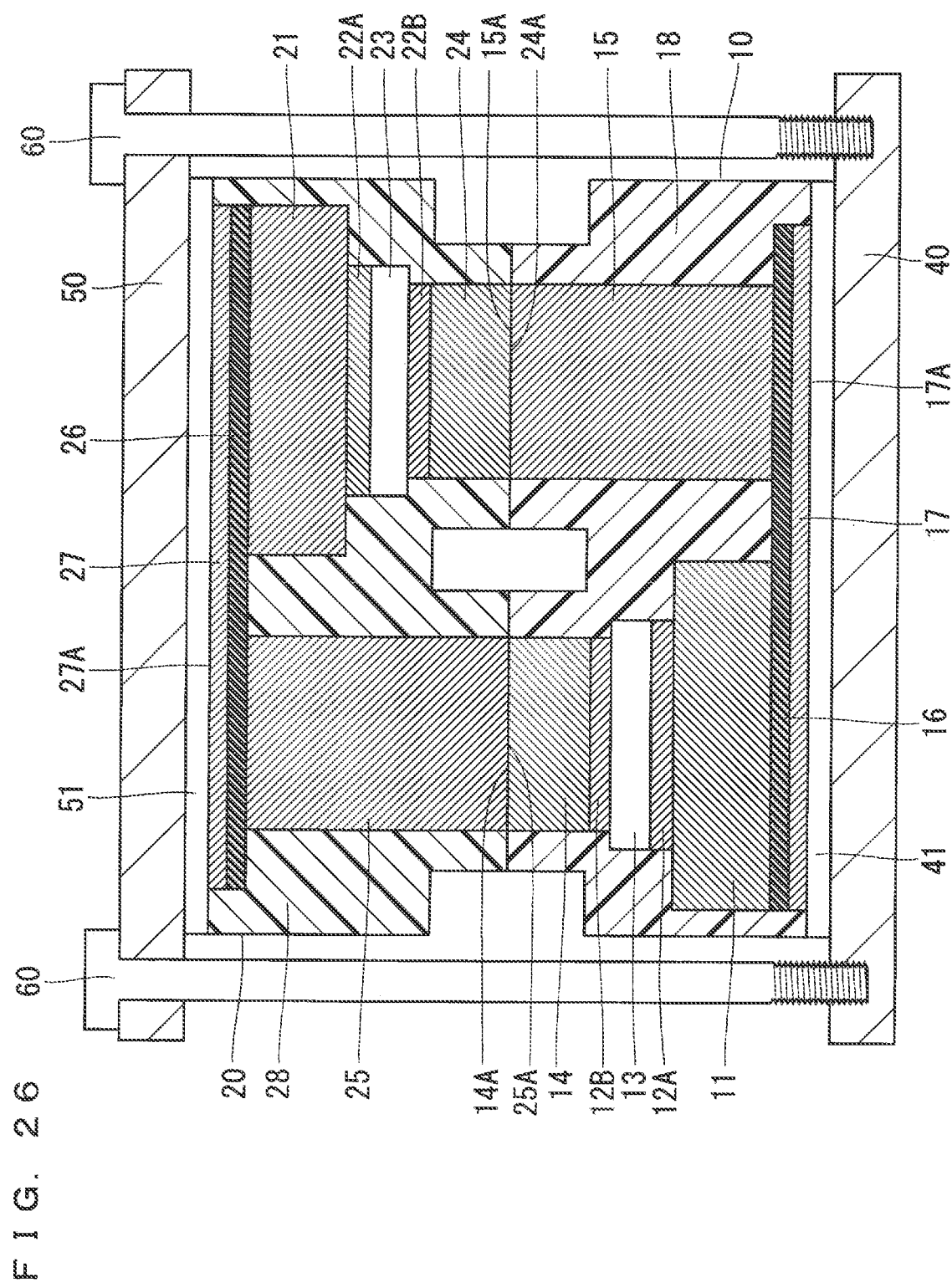
FIG. 26 is a sectional view showing the configuration of a semiconductor device according to a seventh embodiment.

FIG. 26 is a sectional view showing the configuration of the semiconductor device according to the seventh embodiment. The semiconductor device further includes a first cooler 40 and a second cooler 50, The first cooler 40 is joined to the first heat dissipation surface 17A of the first semiconductor package 10 through grease 41. The second cooler 50 is joined to the second heat dissipation surface 27A of the second semiconductor package 20 through grease 51. Further, the second cooler 50 is coupled to the first cooler 40 by screws 60.

By fastening the screws 60, the first cooler 40 and the first semiconductor package 10 are in contact with each other while applying pressure. Similarly, the second cooler 50 and the second semiconductor package 20 are in contact with each other while applying pressure.

Figure 27:
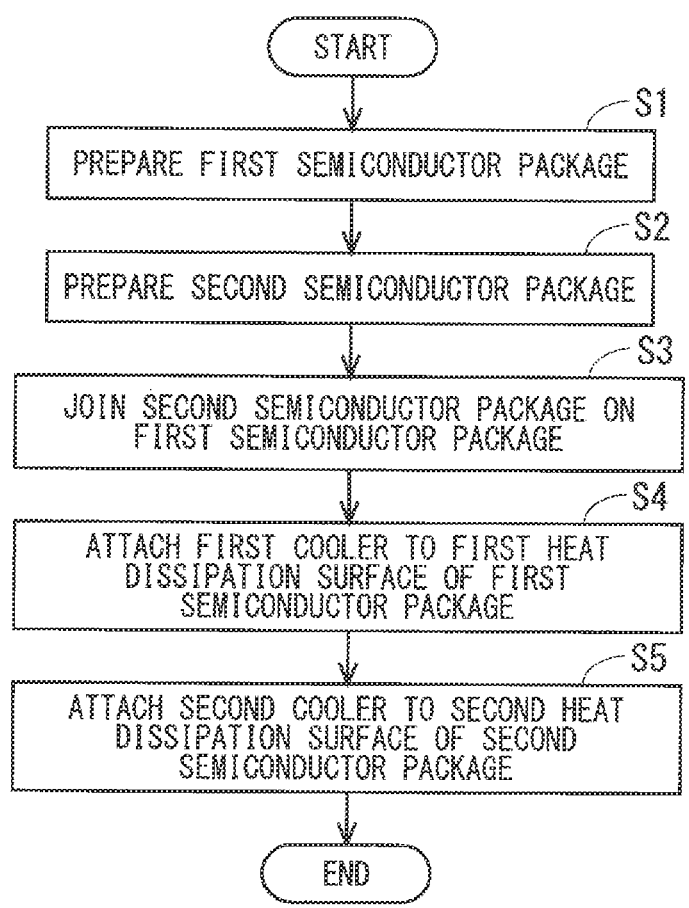
FIG. 27 is a flowchart showing a method of manufacturing the semiconductor device according to the seventh embodiment.

FIG. 27 is a flowchart showing the method of manufacturing the semiconductor device according to the seventh embodiment. Steps S1 to S3 are the same as in the first embodiment.

In step S4, the first cooler 40 is attached to the first heat dissipation surface 17A of the first semiconductor package 10. At this time, the first cooler 40 is joined to the first heat dissipation surface 17A through the grease 41.

In step S5, the second cooler 50 is attached to the second heat dissipation surface 27A of the second semiconductor package 20. At this time, the second cooler 50 is joined to the second heat dissipation surface 27A through the grease 51.

With the above, the semiconductor device shown in FIG. 26 is formed.

Because the above semiconductor device dissipates heat from both of the first heat dissipation surface 17A and the second heat dissipation surface 27A, the first semiconductor chip 13 and the second semiconductor chip 23 are highly efficiently cooled.

Eighth Embodiment

A semiconductor device and a method of manufacturing the semiconductor device according to an eighth embodiment are described. The eighth embodiment is a subordinate concept of the first embodiment, and the semiconductor device in the eighth embodiment includes each configuration of the semiconductor device in the first embodiment. The description of the same configuration and function as in any of the first to seventh embodiments is omitted.

Figure 28:
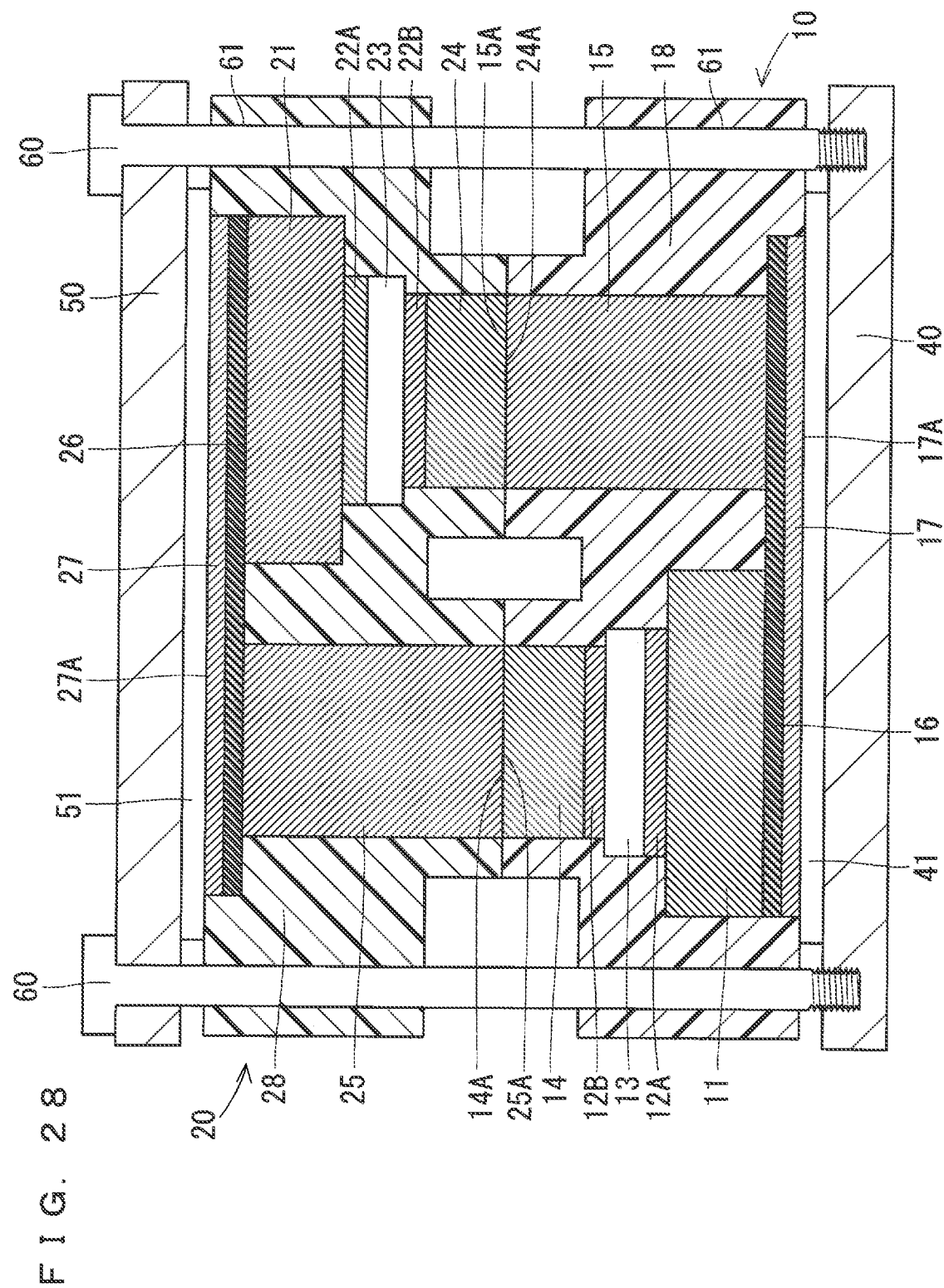
FIG. 28 is a sectional view showing the configuration of a semiconductor device according to an eighth embodiment.

FIG. 28 is a sectional view showing the configuration of the semiconductor device according to the eighth embodiment. The semiconductor device further includes a first cooler 40 and a second cooler 50. The first cooler 40 is joined to the first heat dissipation surface 17A of the first semiconductor package 10 through grease 41. The second cooler 50 is joined to the second heat dissipation surface 27A of the second semiconductor package 20 through grease 51. Further, the second cooler 50 is coupled to the first cooler 40 by screws 60. The first semiconductor package 10 and the second semiconductor package 20 includes through holes 61 through which the screws 60 penetrate, in the first resin part 18 and the second resin part 28, respectively.

The above semiconductor device improves the accuracy of mounting positions of the first semiconductor package 10, the second semiconductor package 20, the first cooler 40, and the second cooler 50 with respect to each other.

Ninth Embodiment

A semiconductor device and a method of manufacturing the semiconductor device according to a ninth embodiment are described. The ninth embodiment is a subordinate concept of the first embodiment, and the semiconductor device in the ninth embodiment includes each configuration of the semiconductor device in the first embodiment. The description of the same configuration and function as in any of the first to eighth embodiments is omitted.

Figure 29:
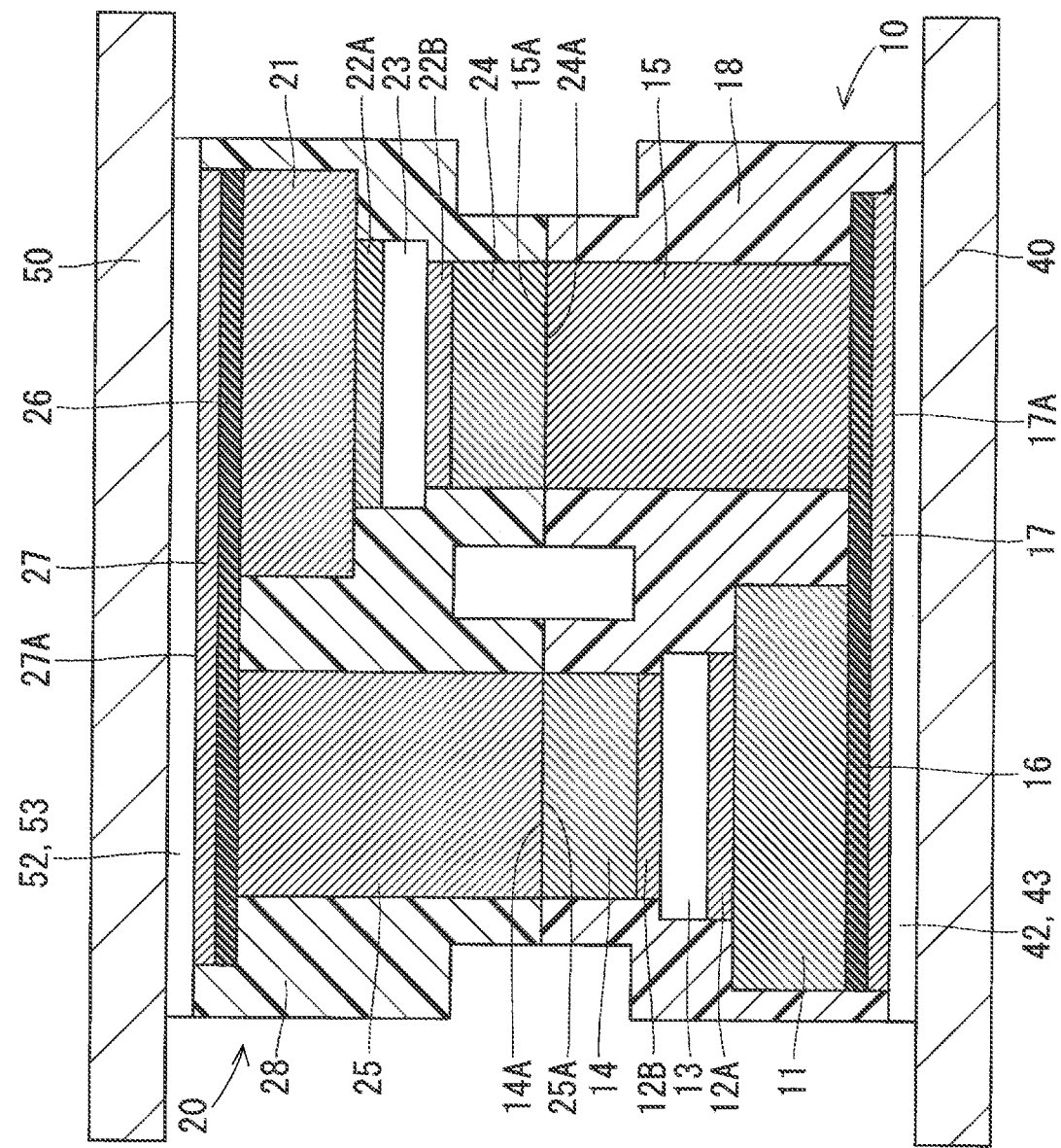
FIG. 29 is a sectional view showing the configuration of a semiconductor device according to the ninth embodiment.

FIG. 29 is a sectional view showing the configuration of the semiconductor device according to the ninth embodiment. The semiconductor device further includes a first cooler 40 and a second cooler 50. The first cooler 40 is joined to the first heat dissipation surface 17A of the first semiconductor package 10 through a solder 42 or a brazing material 43. The second cooler 50 is joined to the second heat dissipation surface 27A of the second semiconductor package 20 a solder 52 or a brazing material 53.

Because the above semiconductor device dissipates heat from both of the first heat dissipation surface 17A and the second heat dissipation surface 27A, the first semiconductor chip 13 and the second semiconductor chip 23 are highly efficiently cooled.

It should be noted that in the present invention, each of the embodiments can be freely combined, and each of the embodiments can be appropriately modified and omitted, within the scope of the present invention.

Although the present invention has been described in detail, the above description is illustrative in all aspects, and the present invention is not limited thereto. It is understood that countless variations that are not illustrated can be envisaged without departing from the scope of the present invention.

EXPLANATION OF REFERENCE SIGNS

10: first semiconductor package
11: first heat spreader
12A: solder
12B solder
13: first semiconductor chip
14: first metal block
14A: first exposed surface
15: second metal block
15A: second exposed surface
16: first insulating film
17: first metal foil
17A: first heat dissipation surface
18: first resin part
20: second semiconductor package
21: second heat spreader
22A: solder
22B: solder
23: second semiconductor chip
24: third metal block
24A: third exposed surface
25: fourth metal block
25A: fourth exposed surface
26: second insulating film
27: second metal foil
27A: second heat dissipation surface
28: second resin part
8: joining layer
9: joining layer
9A: surface treatment layer
9B: surface treatment layer
40: first cooler
41: grease
42: solder
43: brazing material
50: second cooler
51: grease
52: solder
53: brazing material
60: screw
61: through hole

The invention claimed is:
1. A semiconductor device comprising:
a first semiconductor package; and
a second semiconductor package, wherein
the first semiconductor package includes:
  a first exposed surface on which a surface of a first metal block stacked on a first semiconductor chip is exposed;
  a second exposed surface on which a surface of a second metal block not stacked on the first semiconductor chip is exposed from a same side as the first exposed surface; and
  a first heat dissipation surface located on an opposite side to the first exposed surface and the second exposed surface, the first heat dissipation surface being insulated from an internal structure including the first semiconductor chip, the first metal block, and the second metal block,
the second semiconductor package includes:
  a third exposed surface on which a surface of a third metal block stacked on a second semiconductor chip is exposed;
  a fourth exposed surface on which a surface of a fourth metal block not stacked on the second semiconductor chip is exposed from a same side as the third exposed surface; and
  a second heat dissipation surface located on an opposite side to the third exposed surface and the fourth exposed surface, the second heat dissipation surface being insulated from an internal structure including the second semiconductor chip, the third metal block, and the fourth metal block, and
the second semiconductor package is joined on the first semiconductor package in such a manner that the first exposed surface of the first semiconductor package and the fourth exposed surface of the second semiconductor package are connected so as to face each other, and the second exposed surface of the first semiconductor package and the third exposed surface of the second semiconductor package are connected so as to face each other.

2. The semiconductor device according to claim 1, wherein
the first semiconductor package includes:
a first heat spreader having a surface on which the first semiconductor chip and the first metal block are sequentially stacked;
a first insulating film having a surface provided with the first heat spreader and the second metal block adjacent to the first heat spreader; and
a first resin part enclosing the first insulating film, the first heat spreader, the first semiconductor chip, the first metal block, and the second metal block, and having a surface from which the first exposed surface of the first metal block and the second exposed surface of the second metal block are exposed, and
the second semiconductor package includes:
a second heat spreader having a surface on which the second semiconductor chip and the third metal block are sequentially stacked;
a second insulating film having a surface provided with the second heat spreader and the fourth metal block adjacent to the second heat spreader; and
a second resin part enclosing the second insulating film, the second heat spreader, the second semiconductor chip, the third metal block, and the fourth metal block, and having a surface from which the third exposed surface of the third metal block and the fourth exposed surface of the fourth metal block are exposed.

3. The semiconductor device according to claim 2, wherein
the first heat spreader and the second metal block of the first semiconductor package are integrated with each other, and
the second exposed surface of the second metal block is the surface of the first heat spreader.

4. The semiconductor device according to claim 1, wherein the first semiconductor package and the second semiconductor package joined on the first semiconductor package constitute a structure having two-fold symmetry in a sectional view.

5. The semiconductor device according to claim 1, further comprising a joining layer containing gold (Au), the joining layer joining the first exposed surface of the first semiconductor package and the fourth exposed surface of the second semiconductor package together and joining the second exposed surface of the first semiconductor package and the third exposed surface of the second semiconductor package together.

6. The semiconductor device according to claim 1, further comprising a low melting point solder that joins the first exposed surface of the first semiconductor package and the fourth exposed surface of the second semiconductor package together and joins the second exposed surface of the first semiconductor package and the third exposed surface of the second semiconductor package together, wherein
the low melting point solder has a melting point that is lower than a melting point of a solder that fixes the first semiconductor chip inside the first semiconductor package or of a solder that fixes the second semiconductor chip inside the second semiconductor package.

7. The semiconductor device according to claim 1, further comprising conductive grease that joins the first exposed surface of the first semiconductor package and the fourth exposed surface of the second semiconductor package together and joins the second exposed surface of the first semiconductor package and the third exposed surface of the second semiconductor package together.

8. The semiconductor device according to claim 1, further comprising a silver paste that joins the first exposed surface of the first semiconductor package and the fourth exposed surface of the second semiconductor package together and joins the second exposed surface of the first semiconductor package and the third exposed surface of the second semiconductor package together.

9. The semiconductor device according to claim 1, wherein
the first exposed surface and the second exposed surface of the first semiconductor package are located in a same plane, and
the third exposed surface and the fourth exposed surface of the second semiconductor package are located in a same plane.

10. The semiconductor device according to claim 1, wherein the first semiconductor chip and the second semiconductor chip include silicon carbide (SiC).

11. The semiconductor device according to claim 1, wherein the first semiconductor chip and the second semiconductor chip include a reverse conducting insulated gate bipolar transistor (RC-IGBT).

12. The semiconductor device according to claim 1, further comprising:
a first cooler joined to the first heat dissipation surface of the first semiconductor package through grease; and
a second cooler joined to the second heat dissipation surface of the second semiconductor package through grease and connected to the first cooler by screws, wherein,
by fastening the screws, the first cooler and the first semiconductor package are in contact with each other while applying pressure, and the second cooler and the second semiconductor package are in contact with each other while applying pressure.

13. The semiconductor device according to claim 12, wherein the first semiconductor package and the second semiconductor package include through holes through which the screws penetrate respectively.

14. The semiconductor device according to claim 1, further comprising:
a first cooler joined to the first heat dissipation surface of the first semiconductor package through a solder or a brazing material; and
a second cooler joined to the second heat dissipation surface of the second semiconductor package through a solder or a brazing material.

15. A method of manufacturing a semiconductor device comprising the steps:
preparing a first semiconductor package including a first exposed surface on which a surface of a first metal block stacked on a first semiconductor chip is exposed, a second exposed surface on which a surface of a second metal block not stacked on the first semiconductor chip is exposed from a same side as the first exposed surface, and a first heat dissipation surface located on an opposite side to the first exposed surface and the second exposed surface and insulated from an internal structure including the first semiconductor chip, the first metal block, and the second metal block;
preparing a second semiconductor package including a third exposed surface on which a surface of a third metal block stacked on a second semiconductor chip is exposed, a fourth exposed surface on which a surface of a fourth metal block not stacked on the second semiconductor chip is exposed from a same side as the third exposed surface, and a second heat dissipation surface located on an opposite side to the third exposed surface and the fourth exposed surface and insulated from an internal structure including the second semiconductor chip, the third metal block, and the fourth metal block; and joining the second semiconductor package onto the first semiconductor package in such a manner that the first exposed surface of the first semiconductor package and the fourth exposed surface of the second semiconductor package are connected so as to face each other, and the second exposed surface of the first semiconductor package and the third exposed surface of the second semiconductor package are connected so as to face each other.

16. The method of manufacturing the semiconductor device according to claim 15, wherein
the step of preparing the first semiconductor package includes the steps of:
sequentially stacking the first semiconductor chip and the first metal block onto a surface of a first heat spreader;
arranging, on a surface of a first insulating film, the first heat spreader and the second metal block adjacent to the first heat spreader;
sealing, with a resin, the first insulating film, the first heat spreader, the first semiconductor chip, the first metal block, and the second metal block to form a first resin part; and
removing a surface of the first resin part to expose the surface of the first metal block and the surface of the second metal block from the surface of the first resin part, thereby collectively forming the first exposed surface and the second exposed surface, and
the step of preparing the second semiconductor package includes the steps of:
sequentially stacking the second semiconductor chip and the third metal block onto a surface of a second heat spreader;
arranging, on a surface of a second insulating film, the second heat spreader and the fourth metal block adjacent to the second heat spreader;
sealing, with a resin, the second insulating film, the second heat spreader, the second semiconductor chip, the third metal block, and the fourth metal block to form a second resin part; and
removing a surface of the second resin part to expose the surface of the third metal block and the surface of the fourth metal block from the surface of the second resin part, thereby collectively forming the third exposed surface and the fourth exposed surface.

17. The method of manufacturing the semiconductor device according to claim 15, wherein the first semiconductor package and the second semiconductor package joined on the first semiconductor package constitute a structure having two-fold symmetry in a sectional view.

18. The method of manufacturing the semiconductor device according to claim 16, wherein
the first heat spreader and the second metal block of the first semiconductor package are integrated with each other, and
the second exposed surface of the second metal block is the surface of the first heat spreader.

19. The method of manufacturing the semiconductor device according to claim 15, wherein
the step of joining the second semiconductor package on the first semiconductor package includes the steps of:
forming a surface treatment layer containing gold (Au) on each of the first exposed surface and the second exposed surface of the first semiconductor package;
forming a surface treatment layer containing Au on each of the third exposed surface and the fourth exposed surface of the second semiconductor package, and
joining the surface treatment layer on the first exposed surface of the first semiconductor package to the surface treatment layer on the fourth exposed surface of the second semiconductor package, and joining the surface treatment layer on the second exposed surface of the first semiconductor package to the surface treatment layer on the third exposed surface of the second semiconductor package.

20. The method of manufacturing the semiconductor device according to claim 15, wherein
the step of joining the second semiconductor package on the first semiconductor package includes a step of joining, with a low melting point solder, the first exposed surface of the first semiconductor package and the fourth exposed surface of the second semiconductor package together and the second exposed surface of the first semiconductor package and the third exposed surface of the second semiconductor package together, and
the low melting point solder has a melting point that is lower than a melting point of a solder that fixes the first semiconductor chip inside the first semiconductor package or of a solder that fixes the second semiconductor chip inside the second semiconductor package.

21. The method of manufacturing the semiconductor device according to claim 15, wherein the step of joining the second semiconductor package on the first semiconductor package includes a step of joining, with conductive grease, the first exposed surface of the first semiconductor package and the fourth exposed surface of the second semiconductor package together and the second exposed surface of the first semiconductor package and the third exposed surface of the second semiconductor package together.

22. The method of manufacturing the semiconductor device according to claim 15, wherein
the step of joining the second semiconductor package on the first semiconductor package includes a step of joining, with a silver paste, the first exposed surface of the first semiconductor package and the fourth exposed surface of the second semiconductor package together and the second exposed surface of the first semiconductor package and the third exposed surface of the second semiconductor package together, and
the silver paste is sintered by being heated while being pressurized.

23. The method of manufacturing the semiconductor device according to claim 15, wherein
the first exposed surface and the second exposed surface of the first semiconductor package are located in a same plane, and
the third exposed surface and the fourth exposed surface of the second semiconductor package are located in a same plane.

24. The method of manufacturing the semiconductor device according to claim 15, wherein the first semiconductor chip and the second semiconductor chip include silicon carbide (SiC).

25. The method of manufacturing the semiconductor device according to claim 15, wherein the first semiconductor chip and the second semiconductor chip include a reverse conducting insulated gate bipolar transistor (RC-IGBT).

26. The method of manufacturing the semiconductor device according to claim 15, further comprising the steps of:
   joining a first cooler to the first heat dissipation surface of the first semiconductor package with grease; and
   joining a second cooler to the second heat dissipation surface of the second semiconductor package with grease, and coupling the second cooler to the first cooler with screws, wherein,
   by fastening the screws, the first cooler and the first semiconductor package are in contact with each other while applying pressure, and the second cooler and the second semiconductor package are in contact with each other while applying pressure.

27. The method of manufacturing the semiconductor device according to claim 26, wherein the first semiconductor package and the second semiconductor package include through holes through which the screws penetrate respectively.

28. The method of manufacturing the semiconductor device according to claim 15, further comprising the steps of:
   joining a first cooler to the first heat dissipation surface of the first semiconductor package with a solder or a brazing material; and
   joining a second cooler to the second heat dissipation surface of the second semiconductor package with a solder or a brazing material.

* * * * *